US011081507B2

(12) United States Patent
Ishida et al.

(10) Patent No.: US 11,081,507 B2
(45) **Date of Patent: *Aug. 3, 2021**

(54) SEMICONDUCTOR DEVICE AND METHOD FOR MANUFACTURING SAME

(71) Applicant: SAKAI DISPLAY PRODUCTS CORPORATION, Sakai (JP)

(72) Inventors: Shigeru Ishida, Sakai (JP); Tomohiro Inoue, Sakai (JP); Ryohei Takakura, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/615,918

(22) PCT Filed: Jul. 12, 2017

(86) PCT No.: PCT/JP2017/025434
§ 371 (c)(1),
(2) Date: Nov. 22, 2019

(87) PCT Pub. No.: WO2019/012630
PCT Pub. Date: Jan. 17, 2019

(65) Prior Publication Data
US 2020/0212079 A1 Jul. 2, 2020

(51) Int. Cl.
*H01L 27/12* (2006.01)
*H01L 29/786* (2006.01)

(52) U.S. Cl.
CPC ...... *H01L 27/1274* (2013.01); *H01L 27/1229* (2013.01); *H01L 27/1288* (2013.01);
(Continued)

(58) Field of Classification Search
CPC ............ H01L 27/1274; H01L 27/1229; H01L 27/1288; H01L 29/78663; H01L 29/78672;
(Continued)

(56) References Cited

U.S. PATENT DOCUMENTS

2009/0236600 A1* 9/2009 Yamazaki ......... H01L 29/66765 257/59
2012/0220140 A1 8/2012 Kajiyama et al.
(Continued)

FOREIGN PATENT DOCUMENTS

WO 2011/055618 A1 5/2011
WO 2011/132559 A1 10/2011
(Continued)

*Primary Examiner* — Mohammed R Alam
(74) *Attorney, Agent, or Firm* — ScienBiziP, P.C.

(57) ABSTRACT

A semiconductor device includes a thin film transistor 101 including: a semiconductor layer 4 provided on a gate electrode 2 with a gate insulating layer 3 therebetween, wherein the semiconductor layer includes a first region Rs, a second region Rd, and a source-drain interval region RG that is located between the first region and the second region and overlaps with the gate electrode as seem from a direction normal to a substrate; a protection layer 5 arranged on the semiconductor layer 4; a first contact layer Cs in contact with the first region and a second contact layer Cd in contact with the second region; a source electrode 8*s*; and a drain electrode 8*d*, wherein: the semiconductor layer 4 includes a crystalline silicon region 4*p*, and at least a portion of the crystalline silicon region 4*p* is located in the source-drain interval region RG; and at least one opening 10 is provided that runs through the protection layer 5 and the semiconductor layer 4 and reaches the gate insulating layer 3, wherein the at least one opening 10 is located in the source-drain interval region RG as seen from the direction normal to the substrate.

13 Claims, 10 Drawing Sheets

(52) U.S. Cl.
CPC .. *H01L 29/78663* (2013.01); *H01L 29/78672* (2013.01); *H01L 29/78609* (2013.01)

(58) Field of Classification Search
CPC ......... H01L 29/78609; H01L 29/66765; H01L 29/78696; H01L 29/786; G02F 1/1368
See application file for complete search history.

(56) References Cited

U.S. PATENT DOCUMENTS

| | | | | |
|---|---|---|---|---|
| 2017/0154901 | A1* | 6/2017 | Nodera | H01L 27/1222 |
| 2018/0097120 | A1* | 4/2018 | Ishida | H01L 29/78663 |
| 2018/0122839 | A1* | 5/2018 | Nodera | H01L 27/1288 |

FOREIGN PATENT DOCUMENTS

| | | | |
|---|---|---|---|
| WO | 2016/157351 | A1 | 10/2016 |
| WO | 2016/170571 | A1 | 10/2016 |

* cited by examiner (a)

(b)

(c)

(d)

(e)

(a)

(b)

SEMICONDUCTOR DEVICE AND METHOD FOR MANUFACTURING SAME

TECHNICAL FIELD

The present invention relates to a semiconductor device including a thin film transistor, and a method for manufacturing the same.

BACKGROUND ART

Thin film transistors (hereinafter, "TFTs") are used as switching elements in an active matrix substrate, for example. In the present specification, such TFTs are called "pixel TFTs". Conventionally, non-crystalline silicon TFTs using an amorphous silicon film (hereinafter, abbreviated as "a-Si film") as the active layer, crystalline silicon TFTs using a crystalline silicon film (hereinafter, abbreviated as "c-Si film") such as a polycrystalline silicon film as the active layer, and the like, are used as pixel TFTs. Typically, the electric field mobility of a c-Si film is higher than the electric field mobility of an a-Si film, and a crystalline silicon TFT therefore has a higher current driving force (i.e., a larger ON current) than a non-crystalline silicon TFT.

With an active matrix substrate used in a display device, or the like, the c-Si film to be the active layer of the crystalline silicon TFT is formed by forming an a-Si film on a glass substrate and then crystallizing the a-Si film through laser light irradiation (laser annealing).

As a crystallization method using laser annealing, methods have been proposed in the art in which a microlens array is used to converge laser light onto only a region of the a-Si film that is to be the active layer of the TFT, thereby partially crystallizing the a-Si film (Patent Document Nos. 1 to 3). In the present specification, the crystallization method is referred to as "partial laser annealing". Using partial laser annealing, as compared with conventional laser annealing in which the entire surface of the a-Si film is scanned with linear laser light, it is possible to significantly shorten the amount of time required for crystallization and to thereby improve the mass-productivity.

Note that if the active layer of the TFT is formed by using partial laser annealing, the active layer may have a non-crystalline silicon region where it is not irradiated with laser light and remains non-crystalline, as well as a crystalline silicon region where it is irradiated with laser light to be crystallized. The active layer of a "crystalline silicon TFT" as used in the present specification may only be composed of crystalline silicon regions, or may include both crystalline silicon regions and non-crystalline silicon regions.

CITATION LIST

Patent Literature

Patent Document No. 1: International Publication WO2011/132559

Patent Document No. 2: International Publication WO2016/157351

Patent Document No. 3: International Publication WO2016/170571

SUMMARY OF INVENTION

Technical Problem

With a crystalline silicon TFT, as compared with a non-crystalline silicon TFT, the ON current increases but the OFF leak current also increases. Therefore, depending on the application of the crystalline silicon TFT, there is a demand for reducing the OFF leak current.

An object of one embodiment of the present invention, which has been made in view of the above, is to provide a semiconductor device including thin film transistors having a reduced OFF leak current and a method for manufacturing such a semiconductor device.

Solution to Problem

A semiconductor device according to one embodiment of the present invention is a semiconductor device including a thin film transistor, wherein: the thin film transistor includes: a substrate; a gate electrode supported on the substrate; a semiconductor layer provided on the gate electrode with a gate insulating layer therebetween, wherein the semiconductor layer includes a first region, a second region, and a source-drain interval region that is located between the first region and the second region and overlaps with the gate electrode as seen from a direction normal to the substrate, the source-drain interval region including a channel region; a protection layer arranged on the semiconductor layer so as to be in contact with at least a portion of an upper surface of the channel region; a first contact layer in contact with the first region and a second contact layer in contact with the second region; a source electrode electrically connected to the first region with the first contact layer therebetween; and a drain electrode electrically connected to the second region with the second contact layer therebetween; the semiconductor layer includes a crystalline silicon region, and at least a portion of the crystalline silicon region is located in the source-drain interval region; and at least one opening is provided that runs through the protection layer and the semiconductor layer and reaches the gate insulating layer, wherein the at least one opening is located in the source-drain interval region as seen from the direction normal to the substrate.

Advantageous Effects of Invention

According to one embodiment of the present invention, there is provided a semiconductor device including thin film transistors having a reduced OFF leak current and a method for manufacturing such a semiconductor device.

DESCRIPTION OF EMBODIMENTS

Embodiments

A semiconductor device according to one embodiment of the present invention will now be described with reference to the drawings. The semiconductor device of the present embodiment may be any device that includes a crystalline silicon TFT having an active layer including a c-Si region, and generally includes circuit substrates such as active matrix substrates, various display devices such as liquid crystal display devices and organic EL display devices, image sensors, electronic appliances, etc.

Figure 1:
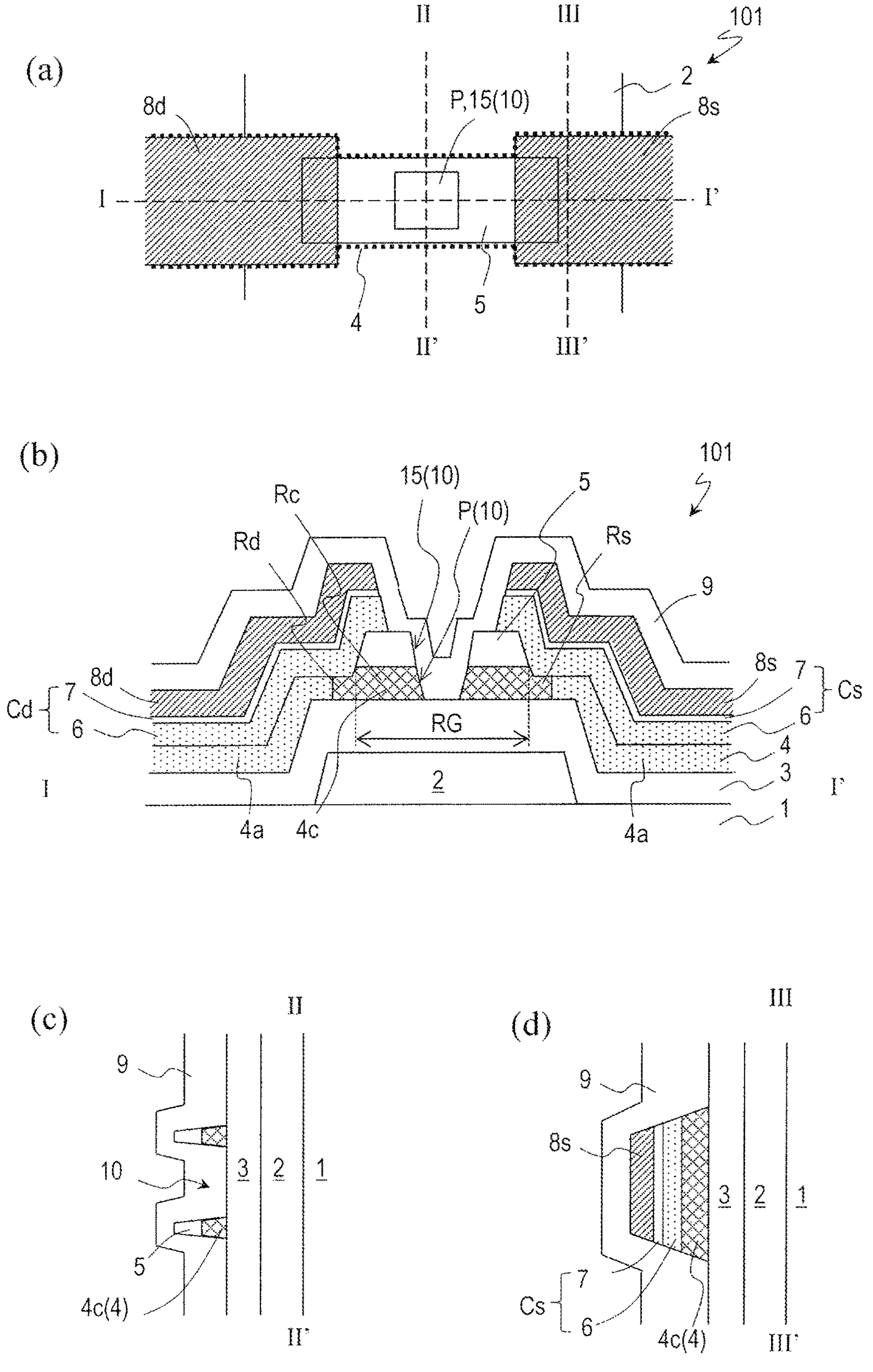
FIGS. 1(*a*) to 1(*d*) are a schematic plan view and schematic cross-sectional views of a TFT 101 according to one embodiment of the present invention.

FIG. 1(*a*) is a schematic plan view of a thin film transistor (TFT) 101 in a semiconductor device of the present embodiment, and FIGS. 1(*b*) to 1(*d*) are cross-sectional views of the TFT 101 taken along line I-I', line II-II' and line III-III', respectively.

The TFT 101 is an etch stop-type (referred to also as etch stopper-type) TFT having a bottom gate structure, for example. The TFT 101 is supported on a substrate 1 such as a glass substrate, and includes: a gate electrode 2 formed on the substrate 1; a gate insulating layer 3 formed on the substrate 1 so as to cover the gate electrode 2; a semiconductor layer (active layer) 4 formed on the gate insulating layer 3; a protection layer (referred to also as an etch stop layer) 5 arranged on the semiconductor layer 4; a first contact layer Cs and a second contact layer Cd; and a source electrode 8*s* and a drain electrode 8*d*. The source electrode 8B is electrically connected to a portion of the semiconductor layer 4 with the first contact layer Cs therebetween. The drain electrode 8*d* is electrically connected to another portion of the semiconductor layer 4 with the second contact layer Cd therebetween.

The semiconductor layer 4 is a layer that functions as the active layer of the TFT 101, and includes a crystalline silicon region (c-Si region) 4*c*. The c-Si region 4*c* is a region that primarily includes crystalline silicon (including polycrystalline silicon, microcrystalline silicon and monocrystalline silicon). At least a portion of the c-Si region 4*c* is arranged so as to overlap with the gate electrode 2 with the gate insulating layer 3 therebetween.

The semiconductor layer 4 may include the c-Si region 4*c*, and the non-crystalline silicon region (a-Si region) 4*a* that primarily includes a-Si. Alternatively, the entire semiconductor layer 4 may be the c-Si region 4*c*. The semiconductor layer 4 is an intrinsic silicon layer, for example. Note that "intrinsic silicon layer" in the present specification refers to a silicon layer that does not substantially include an impurity, i.e., not actively doped with an impurity.

Also, the semiconductor layer 4 includes a first region Rs in contact with the first contact layer Cs, a second region Rd in contact with the second contact layer Cd, and a region located between the first region Rs and the second region Rd (hereinafter referred to as the "source-drain interval region") RG. The first region Rs is electrically connected to the source electrode 8*s* with the first contact layer Cs therebetween. The second region Rd is electrically connected to the drain electrode 8*d* with the second contact layer Cd therebetween. The source-drain interval region RG is a portion of the semiconductor layer 4 that overlaps with the gate electrode 2 with the gate insulating layer 3 therebetween and is located between the first region Rs and the second region Rd, and includes the channel region Rc where the channel of the TFT 101 is formed. As will be described below, a semiconductor layer opening P is arranged in the source-drain interval region RG of the semiconductor layer 4. For example, a portion of the source-drain interval region RG where the semiconductor layer opening P is absent is the "channel region Rc".

In the semiconductor layer 4, at least a portion of the c-Si region 4*c* is located in the source-drain interval region RG. In this example, the source-drain interval region RG includes the c-Si region 4*c* and does not include the a-Si region 4*a*. Note that the source-drain interval region RG may include both of the c-Si region 4*c* and the a-Si region 4*a* (see FIGS. 12 and 13 to be described below).

it is preferred that the first region Rs and the second region Rd of the semiconductor layer 4 each include the c-Si region 4*c*. The first region Rs and the second region Rd may each be composed only of the c-Si region 4*c* or may include both of the c-Si region 4*c* and the a-Si region 4*a*.

The protection layer 5 is arranged on a portion of the semiconductor layer 4 so as to be in contact with at least a portion of the upper surface of the channel region Re. The protection layer 5 may be in contact with the entire upper surface of the channel region Rc. Herein, the protection layer 5 has an island-like pattern. Note that the protection layer 5 does not need to have an island-like pattern. In such a case, the protection layer 5 may have an opening that exposes the first region Rs and the second region Rd of the semiconductor layer 4.

The protection layer 5 and the semiconductor layer 4 has an opening 10 that runs through the protection layer 5 and the semiconductor layer 4 and exposes a portion of the gate insulating layer 3. The opening 10 is composed of a protection layer opening (referred to also as the "first opening") 15 formed in the protection layer 5, and a semiconductor layer opening (referred to also as the "second opening") P formed in the semiconductor layer 4. The opening 10 is located within the source-drain interval region RG as seen from the direction normal to the substrate 1.

In the present embodiment, the side surface of the protection layer opening 15 and the side surface of the semiconductor layer opening P are aligned with each other at the side wall of the opening 10. In other words, as seen from the direction normal to the substrate 1, the protection layer opening 15 and the semiconductor layer opening P are generally aligned with each other. For example, such an opening 10 can be formed by patterning the semiconductor layer 4 and the protection layer 5 using the same mask, or patterning the semiconductor layer 4 using the protection layer 5 with the protection layer opening 15 formed therein as a mask. The details will be described below.

In FIG. 1(*a*), the periphery of the semiconductor layer 4 is denoted by a broken line. As shown in the figure, the semiconductor layer 4 may be located only between the protection layer 5, the source electrode 8B and the drain electrode 8*d*, and the gate insulating layer 3. The semiconductor layer 4 may be provided to extend into a region other than the region where the TFT 101 is formed (TFT formation region). For example, the semiconductor layer 4 may extend so as to overlap with a source bus line that is connected to the source electrode 8*s*. Only a portion of the semiconductor layer 4 that is located in the TFT formation region needs to include the c-Si region 4*c*, and a portion that is provided to extend into a region other than the TFT formation region may be the a-Si region 4*a*.

The first contact layer Cs and the second contact layer Cd are arranged spaced apart from each other. While there is no particular limitation on the first contact layer Cs and the second contact layer Cd, they may include a silicon layer that includes a conductivity type determining impurity (which may be either an a-Si layer or a c-Si layer), for example. In this example, the first contact layer Cs and the second contact layer Cd each include a first a-Si layer 6 in contact with the semiconductor layer 4 and a second a-Si layer 7 arranged on the first a-Si layer 6. The second a-Si layer 7 has a higher conductivity than the first a-Si layer 6. The second a-Si layer 7 may include a conductivity type determining impurity. The first a-Si layer 6 may be an intrinsic silicon layer that does not substantially include an impurity, for example, and the second a-Si layer 7 may be an $n^+$-type a-Si layer doped with an n-type giving impurity. Where the first a-Si layer 6 includes an impurity, the second a-Si layer 7 may include a conductivity type determining impurity at a higher concentration than the first a-Si layer 6. Note that the first contact layer Cs and the second contact layer Cd may have a single-layer structure of the second a-Si layer (e.g., an $n^+$-type a-Si layer) 7. Note however that it is possible to suppress deterioration of the TFT characteristic due to hot carriers by providing the first a-Si layer 6 between the c-Si region 4*c* of the semiconductor layer 4 and the second a-Si layer 7.

The TFT 101 may be covered by an inorganic insulating layer (passivation film) 9, for example. The inorganic insulating layer 9 may be in contact with the gate insulating layer 3 in the opening 10. An organic insulating layer (not shown) may be further provided on the inorganic insulating layer 9. The organic insulating layer may be a flattening film.

With the TFT 101, in the ON state, a current flow from one electrode, of the source electrode 8*s* and the drain electrode 8*d*, to the other electrode. For example, where a current flows in the direction from the source electrode 8*s* to the drain electrode 8*d*, the current flows from the source electrode 8*s*, passes through the first contact layer Cs, flows through the channel region Rc of the semiconductor layer 4, and then passes through the second contact layer Cd to reach the drain electrode 8*d*.

In the present embodiment, the semiconductor layer opening P is provided on the path of the current flowing between the source electrode 8*s* and the drain electrode 8*d* in the source-drain interval region RG, thereby inhibiting the current flow. Thus, it is possible to reduce the OFF leak current.

With the provision of the semiconductor layer opening P, not only the OFF leak current but also the ON current decreases. However, in the present embodiment, Since the high mobility c-Si region 4*c* is used in the channel region Rc, it is possible to ensure a predetermined ON characteristic even if the ON current somewhat lowers due to the formation of the semiconductor layer opening P. Moreover, since the current inhibiting effect of the semiconductor layer opening P is more pronounced for the OFF current than for the ON current, it is possible to decrease the OFF current while ensuring the ON characteristic by controlling the size, position, etc., of the semiconductor layer opening P.

As will be described below, by providing the semiconductor layer opening P in the semiconductor layer 4 by using the protection layer 5 as a mask, for example, it is possible to manufacture the TFT 101 having a reduced OFF leak current while suppressing an increase in the number of manufacturing steps.

Note that one may consider reducing the OFF leak current by decreasing the width of the active layer (the channel width) of the TFT without providing an opening in the active layer of the TFT, for example. However, where the TFT is manufactured by using a photolithography process (including resist formation, exposure, development, etching using the resist as a mask and resist peeling), the width of the active layer may not be sufficiently miniaturized depending on the process precision. As an example, where the process precision of the photolithography process is 6 μm, it is difficult to form an active layer (silicon layer) having a width of 5 μm. On the other hand, it is possible to form, with a high precision, an opening having a width of 15 μm in the active layer having a width of 20 μm, and it is therefore possible to obtain the active layer having an effective channel width (effective channel width) of 5 μm. Therefore, according to the present embodiment, with the provision of the semiconductor layer opening P, it is possible to form, with a higher precision, a TFT whose effective channel width is small or whose effective area of the channel region (effective channel area) is small.

The position, shape, etc., of the semiconductor layer opening P provided in the semiconductor layer 4 are not limited to those of the illustrated example. As will be described below, two or more semiconductor layer openings P may be arranged in the source-drain interval region RG.

The semiconductor layer opening P may be arranged inside the c-Si region 4*c* and surrounded by the c-Si region 4*c*. That is, a portion of the semiconductor layer 4 that is exposed on the side surface of the opening 10 may be crystalline silicon. Alternatively, the semiconductor layer opening P may be formed so as to bridge between the c-Si region 4*c* and the a-Si region 4*a*. For example, as seen from the direction normal to the substrate 1, in the source-drain interval region RG, the semiconductor layer opening P may be arranged on a portion of the interface between the c-Si region 4*c* and the a-Si region 4*a*. Or, the semiconductor layer opening P may be arranged inside the a-Si region 4*a* and surrounded by the a-Si region 4*a*. Note however that as long as at least a portion of the semiconductor layer opening P is formed in the c-Si region 4*c*, it is possible to more effectively reduce the OFF leak current.

According to the present embodiment, it is possible to arbitrarily select not only the position, size and shape of the semiconductor layer opening P, but also the positional relationship between the semiconductor layer opening P and the c-Si region 4*c* and the a-Si region 4*a*, and it is therefore possible to obtain TFTs having desired characteristics depending on the application. For example, where a plurality of TFTs for different applications are formed on the substrate 1, it is possible to change the positional relationship between openings and the c-Si region 4*c* and the a-Si region 4*a*, as well as the presence/absence, size, number, arrangement, etc., of the openings for each TFT, without complicating the manufacturing process. Therefore, it is possible to selectively produce TFTs of different characteristics by the same manufacturing step.

In the example shown in FIG. 1, the semiconductor layer 4 and the contact layers Cs and Cd are provided to extend under the source electrode 8*s* and the drain electrode 8*d*. Therefore, it is possible to adjust the area (contact area) of a portion (the c-Si region 4*c*) of the semiconductor layer 4 that is to be the first region Rs and the second region Rd, without increasing the size of the TFT 101.

In the example shown in FIG. 1, end portions of the first contact layer Cs and the second contact layer Cd on the channel region Rc side are located over the protection layer 5. That is, the protection layer 5 is arranged between the semiconductor layer 4 and the first contact layer Cs and the second contact layer Cd. The first contact layer Cs and the second contact layer Cd are each in contact with a portion of the side surface and a portion of the upper surface of the protection layer 5. Note that the first contact layer Cs and the second contact layer Cd each only need to be in contact with the first region Rs and the second region Rd of the semiconductor layer 4 and do not need to be in contact with the protection layer 5.

While the first contact layer Cs and the second contact layer Cd are aligned with the source electrode 8*s* and the drain electrode 8*d*, respectively, as seen from the direction normal to the substrate 1, in the illustrated example, they may have shapes different from the source electrode 8*a* and the drain electrode 8*d*.

Moreover, while the width of the source electrode 8*s* and the drain electrode 8*d* is greater than the width of the channel region Rc of the semiconductor layer 4 in the channel width direction of the TFT 101 in FIG. 1, it may be equal to or smaller than the width of the channel region Rc.

The semiconductor device of the present embodiment is an active matrix substrate having a TFT 101 as a pixel TFT for each pixel, for example. With an active matrix substrate, a pixel electrode (not shown) is arranged on the interlayer insulating layer including the inorganic insulating layer 9 for each pixel. The drain electrode 8*d* of a TFT 101 is electrically connected to the corresponding pixel electrode. The pixel electrode may be in contact with the drain electrode 8*d* of the TFT 101 in a contact hole (not shown) formed in the interlayer insulating layer. The source electrode 8*s* of the TFT 101 is electrically connected to the source bus line (not shown), and the gate electrode 2 is electrically connected to the gate bus line (not shown).

An active matrix substrate may have a display region including a plurality of pixels, and a non-display region (referred to also as a peripheral region) other than the display region. In the peripheral region, a driving circuit such as a gate driver may be formed monolithically. A driving circuit includes a plurality of TFTs (referred to as "circuit TFTs"). A circuit TFT may be a crystalline silicon TFT having a similar configuration to that of the TFT 101. Note however that no opening may be provided in the source-drain interval region of some or all of the circuit TFTs. For example, it is preferred that no opening is provided in the source-drain interval region of a circuit TFT that is required to have a large current driving force, such as an output transistor.

<Method for Manufacturing Semiconductor Device>

FIG. 2 to FIG. 7 are schematic step-by-step views illustrating an example of a method for manufacturing a semiconductor device having the TFT 101 (active matrix substrate). In each figure, (a) is a plan view. In each figure, (b) and (c) are cross-sectional views taken respectively along line I-I' and line II-II' shown in FIG. 1. In FIG. 4 to FIG. 7, (d) is a cross-sectional view taken along line III-III' shown in FIG. 1.

Figure 2:
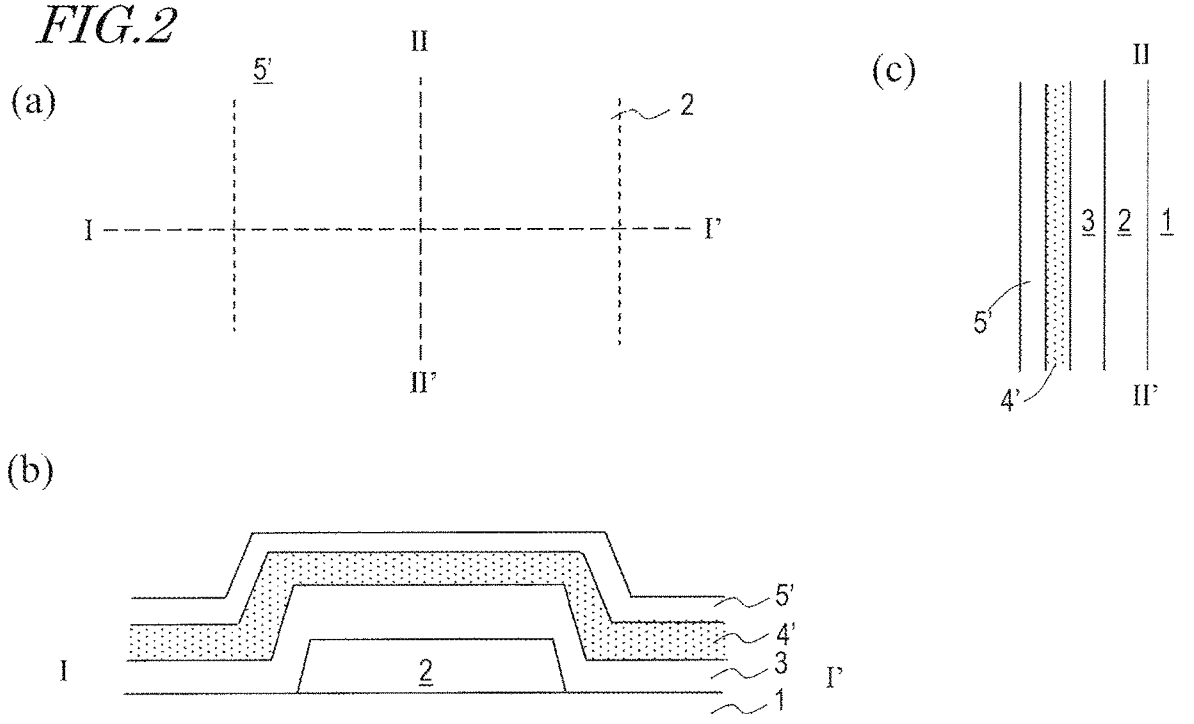
FIGS. 2(*a*) to 2(*c*) are a schematic step-by-step plan view and schematic step-by-step cross-sectional views illustrating an example of a method for manufacturing a semiconductor device according to one embodiment of the present invention.

First, as shown in FIGS. 2(*a*) to 2(*c*), the gate electrode 2, the gate insulating layer 3, a semiconductor film 4' to be the active layer of the TFT, and a protection film (insulating film) 5' to be the protection layer are formed in this order on the substrate 1.

A substrate having an insulative surface, such as a glass substrate, a silicon substrate or a heat-resistant plastic substrate (resin substrate), for example, may be used as the substrate 1.

The gate electrode 2 is formed by forming a gate conductive film on the substrate 1 and patterning the gate conductive film. Herein, a gate conductive film (thickness: about 500 nm, for example) is formed on the substrate 1 by a sputtering method, for example, and the metal film is patterned by using a known photolithography process. For example, wet etching is used for etching the gate conductive film.

The material of the gate electrode 2 may be a single metal such as molybdenum (Mo), tungsten (W), copper (Cu), chromium (Cr), tantalum (Ta), aluminum (Al) and titanium (Ti), a material obtained by mixing nitrogen, oxygen or another metal therewith, or a transparent conductive material such as indium tin oxide (ITO).

The gate insulating layer 3 is formed by a plasma CVD method, for example, on the substrate 1 with the gate electrode 2 formed thereon. For example, a silicon oxide ($SiO_2$) layer, a silicon nitride (SiNx) layer, or a layered film of an $SiO_2$ layer and an SiNx layer may be formed as the gate insulating layer (thickness: about 0.4 μm, for example) 3.

The semiconductor film 4' and the protection film 5' can be formed by a CVD method using the same deposition chamber as the gate insulating layer 3. Herein, as the semiconductor film 4', an a-Si:H film having a thickness of 30 nm or more and 70 nm or less, for example, is formed by using a hydrogen gas ($H_2$) and a silane gas ($SiH_4$). An $SiO_2$ film, for example, is formed as the protection film 5'. For example, the thickness of the protection film 5' may be 30 nm or more and 300 nm or less, preferably, 50 nm or more and 200 nm or less. If 30 nm or more, preferably 50 nm or more, it can sufficiently function as an etching mask of the semiconductor film 4' in a subsequent step, in addition to functioning as an etch stop layer. On the other hand, if 300 nm or less, preferably 200 nm or less, it is possible to more easily form a high-precision opening (or notch) in a subsequent step. Moreover, when providing a passivation film so as to cover the TFT, it is possible to ensure the coverage of the passivation film by suppressing production of steps due to an opening.

Thereafter, dehydrogenation annealing (e.g., 450° C., 60 min) is performed for the semiconductor film 4'. Next, a cleaning process (pre-laser cleaning) such as ozone cleaning or HF cleaning is performed.

Figure 3:
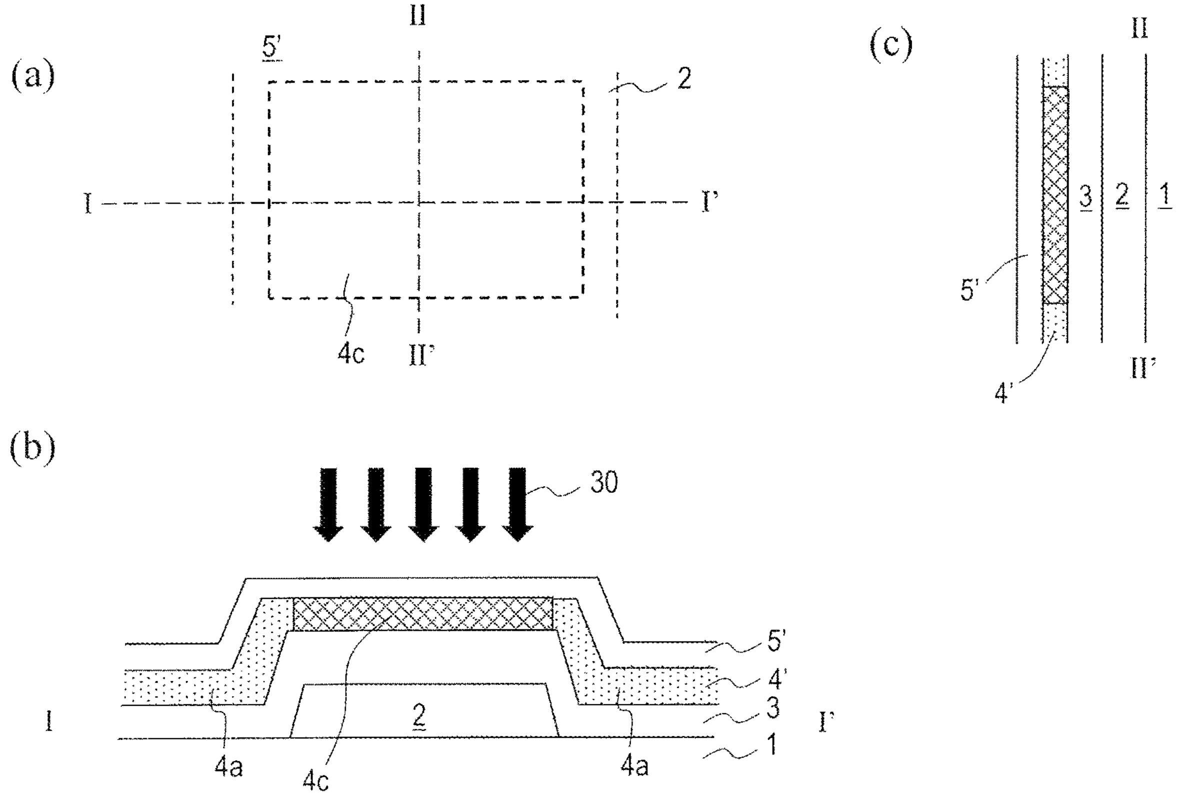
FIGS. 3(*a*) to 3(*c*) are a schematic step-by-step plan view and schematic step-by-step cross-sectional views illustrating an example of a method for manufacturing a semiconductor device according to one embodiment of the present invention.

Then, as shown in FIGS. 3(*a*) to 3(*c*), the semiconductor film 4' is irradiated with laser light 30 from above the protection film 5', thereby crystallizing only a portion of a semiconductor layer formation region of the semiconductor film 4' that is to be the semiconductor layer of the TFT (partial laser annealing). Solid state laser whose wavelength is 550 nm or less, e.g., ultraviolet laser such as XeCl excimer laser (wavelength: 308 nm) or the second harmonic of YAG laser (wavelength: 532 nm) may be used as the laser light 30.

In the present embodiment, the semiconductor film 4' on the substrate 1 is irradiated with the laser light 30 from a laser light source through a microlens array. The microlens array includes a two-dimensional or one-dimensional array of microlenses. When forming a plurality of TFTs on the substrate 1, the laser light 30 is converged by the microlens array to be incident only upon a plurality of predetermined regions (irradiated regions) of the semiconductor film 4' that are spaced apart from each other. Each irradiated region is arranged so as to correspond to a portion to be the channel region of a TFT. The position, number, shape, size, etc., of the irradiated regions can be controlled by the size of the microlens (which is not limited to a lens that is less than 1 mm), the arrangement pitch thereof, the position of the opening in the mask to be arranged on the light source side of the microlens array. Thus, the region of the semiconductor film 4' that is irradiated with the laser light 30 is heated to be melted and solidified, and becomes the c-Si region 4*c*. The region that is not irradiated with the laser light remains as the a-Si region 4*a*.

For the more specific method for partial laser annealing and the configuration of the apparatus used for partial laser annealing (including the structure of a microlens array and a mask), the entire disclosures of International Publication WO2011/055618, International Publication WO2011/132559 (Patent Document No. 1), International Publication WO2016/157351 (Patent Document No. 2) and International Publication WO2016/170571 (Patent Document No. 3) are herein incorporated by reference.

Note that in the present embodiment, after the protection film 5' is formed, the step of crystallizing the semiconductor film 4' is performed through the protection film 5'. However, the crystallization step may be performed before the formation of the protection film 5'.

Figure 4:
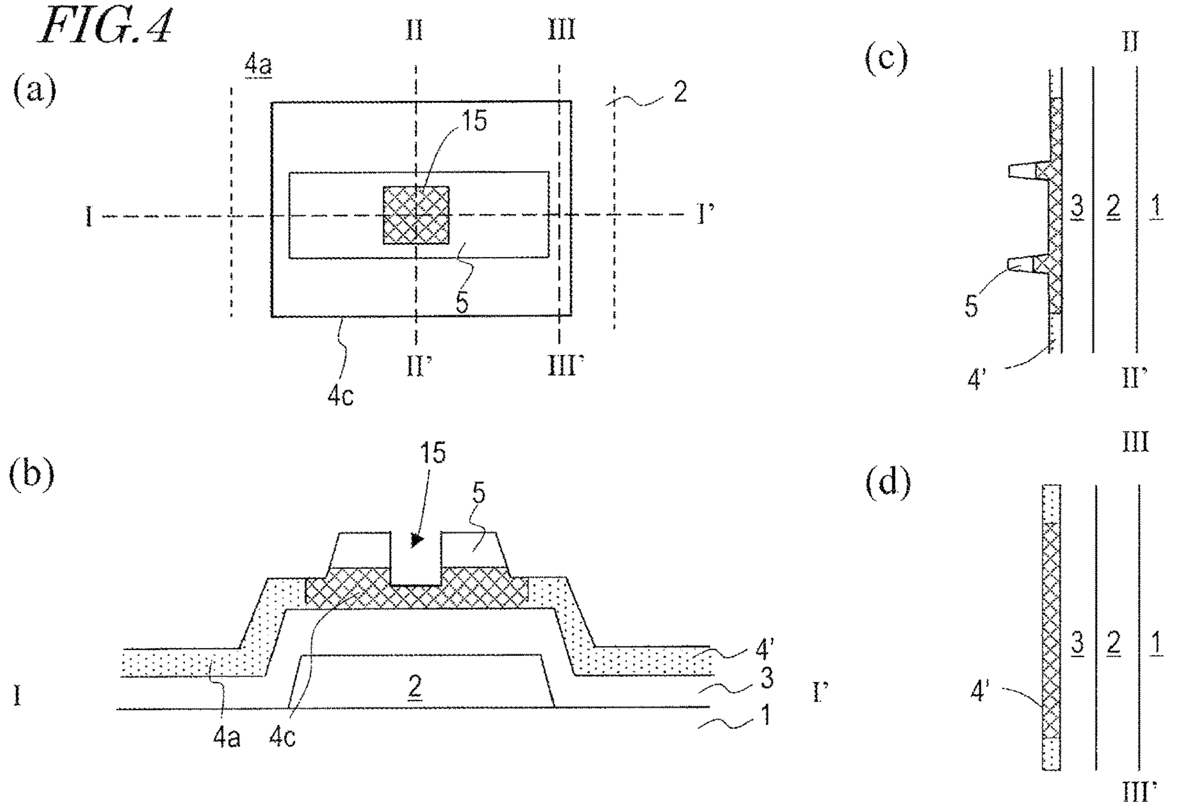
FIGS. 4(*a*) to 4(*d*) are a schematic step-by-step plan view and schematic step-by-step cross-sectional views illustrating an example of a method for manufacturing a semiconductor device according to one embodiment of the present invention.

Next, as shown in FIGS. 4(*a*) to 4(*d*), a first resist mask (not shown) is formed on the protection film 5', and the protection film 5' is patterned using the first resist mask. The patterning of the protection film 5' is performed by dry etching, for example. Thus, the protection layer 5 is formed on at least a part of the portion of the semiconductor film 4' that is to be the channel region, wherein the protection layer 5 has the protection layer opening 15 that exposes the semiconductor film 4'. The protection layer 5 may have an island-like pattern, for example. As shown in the figure, when the protection film 5' is patterned, a surface portion of the semiconductor film 4' may possibly be etched (over-etched). Thereafter, the first resist mask is peeled off the substrate 1.

While one protection layer opening 15 is formed in one TFT formation region in this example, two or more protection layer openings 15 may be formed. Alternatively, one or more notches may be formed instead of, or in addition to, the protection layer opening 15. For example, a "notch" includes a depressed portion arranged on the periphery of the protection layer 5 as seen from the direction normal to the substrate 1.

Figure 5:
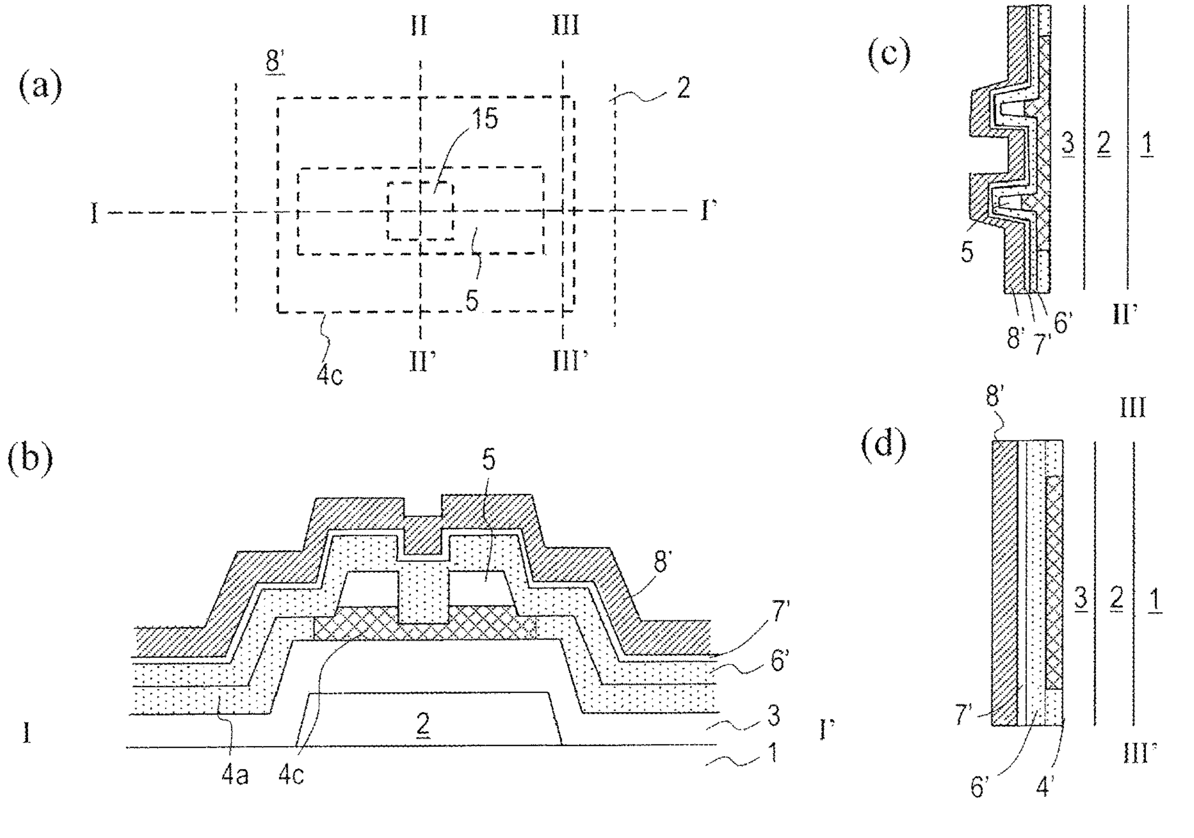
FIGS. 5(*a*) to 5(*d*) are a schematic step-by-step plan view and schematic step-by-step cross-sectional views illustrating an example of a method for manufacturing a semiconductor device according to one embodiment of the present invention.

Next, as shown in FIGS. 5(*a*) to 5(*d*), a contact layer Si film and a source and drain electrode conductive film 8' are formed in this order on the semiconductor film 4' and the protection layer 5.

Herein, as the contact layer Si film, an intrinsic first a-Si film (thickness: about 0.1 μm, for example) 6' and an $n^+$-type second a-Si film (thickness: about 0.05 μm, for example) 7' including an n-type impurity (e.g., phosphorus (P)) are deposited in this order by a plasma CVD method. A hydrogen gas and a silane gas are used as the material gas of the first a-Si film 6'. A mixed gas of silane, hydrogen and phosphine ($PH_3$) is used as the material gas of the second a-Si film 7'.

The source and drain electrode conductive film (thickness: about 0.3 μm, for example) 8' can be formed by a method similar to the gate conductive film using a material similar to the gate conductive film.

Figure 6:
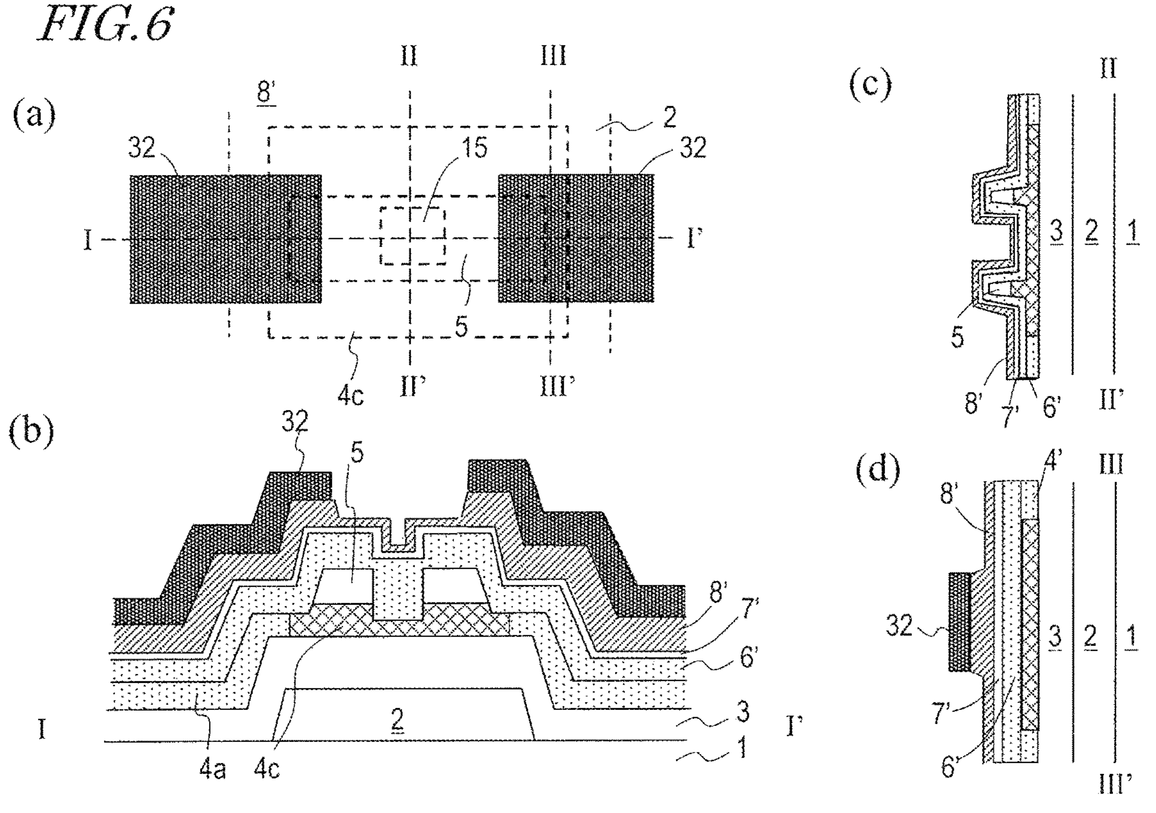
FIGS. 6(*a*) to 6(*d*) are a schematic step-by-step plan view and schematic step-by-step cross-sectional views illustrating an example of a method for manufacturing a semiconductor device according to one embodiment of the present invention.

Thereafter, as shown in FIGS. 6(*a*) to 6(*d*), a second resist mask 32 is formed on the conductive film 8', and the conductive film 8' is patterned using this as a mask. The patterning of the conductive film 8' can be performed by using a wet etching method, for example. A solution containing phosphoric acid, nitric acid and acetic acid may be used as the etchant. This reduces the thickness of a portion of the conductive film 8' that is not covered by the second resist mask 32. Note that through this etching, a portion of the conductive film 8' that is not covered by the second resist mask 32 may be removed.

Figure 7:
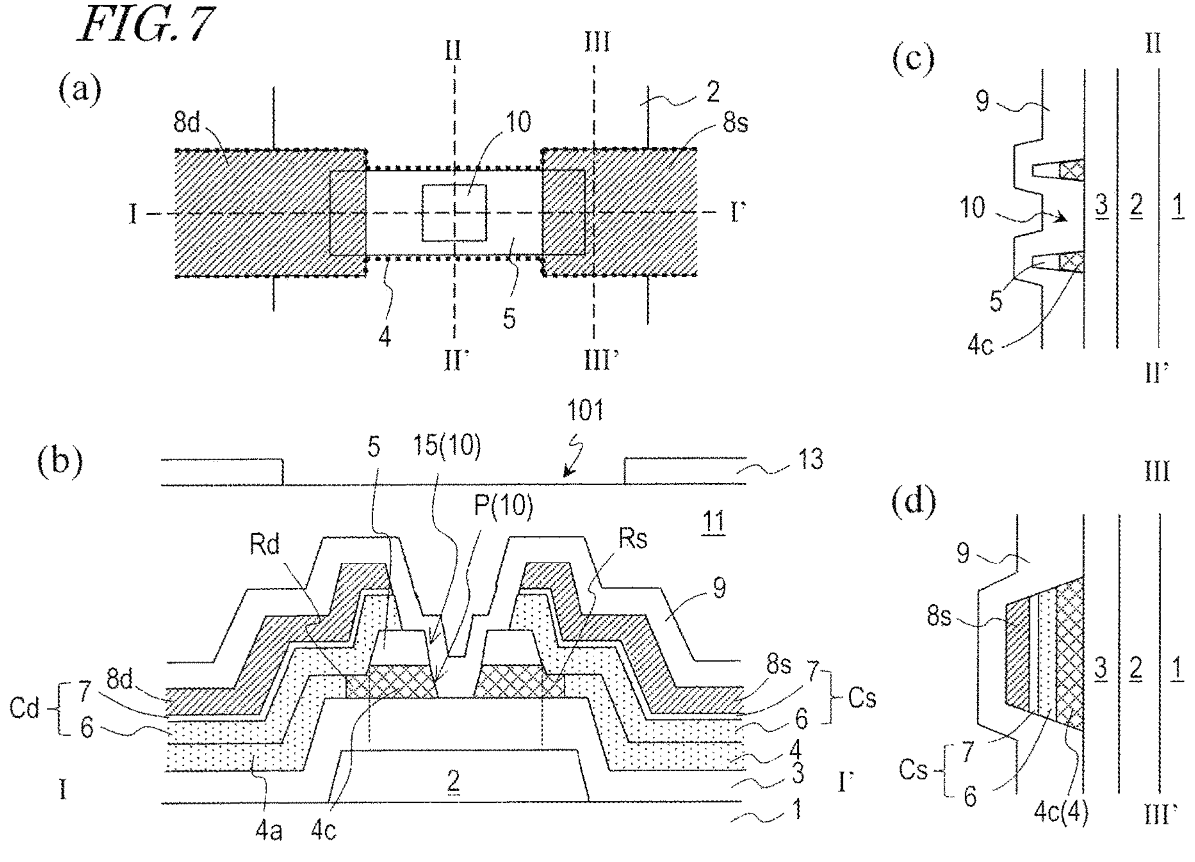
FIGS. 7(*a*) to 7(*d*) are a schematic step-by-step plan view and schematic step-by-step cross-sectional views illustrating an example of a method for manufacturing a semiconductor device according to one embodiment of the present invention.

Then, as shown in FIGS. 7(*a*) to 7(*d*), the conductive film 8', the first a-Si film 6' and the second a-Si film 7' are patterned using the second resist mask 32 as a mask. Herein, dry etching using a chlorine ($Cl_2$) gas, for example, is performed. Thus, the source electrode 8B and the drain electrode 8*d* are obtained from the conductive film 8' (source-drain separation step). As seen from the direction normal to the substrate 1, the source electrode 8B and the drain electrode 8*d* are arranged with an interval therebetween so that the protection layer opening 15 or a notch is located between the source electrode 8B and the drain electrode 8*d*. The first contact layer Cs and the second contact layer Cd including the first a-Si layer 6 and the second a-Si layer 7 are obtained from the a-Si films 6' and 7'. At the same time, the semiconductor film 4' is patterned using the second resist mask 32, the source electrode 8*s*, the drain electrode 8*d* and the protection layer 5 as a mask. This removes portions of the semiconductor film 4' other than those portions that are located under the source electrode 8*s*, the drain electrode 8*d* and the protection layer 5. A portion of the semiconductor film 4' that is exposed in the protection layer opening 15 is also removed, forming the semiconductor layer opening P. Thus, the semiconductor layer 4 is obtained, which has the semiconductor layer opening P that exposes the gate insulating layer 3 at a position corresponding to the protection layer opening 15. Thereafter, the second resist mask 32 is removed. Thus, the TFT 101 shown in FIGS. 1(*a*) to 1(*d*) is manufactured.

With this patterning step, as seen from the direction normal to the substrate 1, the periphery of the first contact layer Cs and the periphery of the source electrode 8*s* are aligned with each other, and the periphery of the second contact layer Cd and the periphery of the drain electrode 8*d* are aligned with each other. The semiconductor layer 4 is located only between the protection layer 5, the source electrode 8*s* and the drain electrode 8*d*, and the gate insulating layer 3. The periphery of the semiconductor layer 4 is aligned with the protection layer 5, the source electrode 8*s* or the drain electrode 8*d* as seen from the direction normal to the substrate 1, as indicated by a broken line in FIG. 1(*a*). The semiconductor layer 4, the first a-Si layer 6 and the second a-Si layer 7 are layered in this order between the gate insulating layer 3 and the source electrode 8*s* and the drain electrode 8*d*.

Thereafter, an interlayer insulating layer is formed so as to cover the TFT 101. Herein, the inorganic insulating layer 9 and an organic insulating layer 11 are formed as the interlayer insulating layer. A pixel electrode 13 is provided on the organic insulating layer 11.

A silicon oxide layer, a silicon nitride layer, or the like, may be used as the inorganic insulating layer 9. Herein, for example, an SiNx layer (thickness: about 200 nm, for example) is formed by a CVD method as the inorganic insulating layer 9. For example, the organic insulating layer 11 may be an organic insulating film (thickness: 1 to 3 μm, for example) including a photosensitive resin material. Thereafter, the organic insulating layer 11 is patterned to form an opening (not shown). Then, the inorganic insulating layer 9 is etched (dry etched) using the organic insulating layer 11 as a mask. Thus, a contact hole (not shown) reaching the drain electrode 8*d* is formed in the inorganic insulating layer 9 and the organic insulating layer 11.

The pixel electrode 13 is formed as follows. First, a transparent conductive film is formed on the organic insulating layer 11 and in the contact hole. A metal oxide such as indium-tin oxide (ITO), indium-zinc oxide or ZnO can be used as the material of the transparent electrode film. Herein, for example, an indium-zinc oxide film (thickness: about 100 nm, for example) is formed by a sputtering method as the transparent conductive film. Thereafter, the transparent conductive film is patterned by wet etching, for example, to obtain pixel electrodes 13. The pixel electrodes 13 are arranged spaced apart from each other corresponding to pixels. Each pixel electrode 13 is in contact with the drain electrode 8*d* of the corresponding TFT in the contact hole. Thus, an active matrix substrate is manufactured.

With the method described above, it is possible to form the semiconductor layer opening P in the source-drain interval region RG of the semiconductor layer 4 by using the protection layer 5 as a mask in the step of patterning the semiconductor film 4'. Therefore, it is possible to manufacture the TFT 101 having a reduced OFF leak current without complicating the manufacturing step or increasing the number of photomasks. Since partial laser annealing is used, it is possible to crystallize only a predetermined region of the semiconductor film 4'.

Note that the method for crystallizing the semiconductor film is not limited to the partial laser annealing described above. A part or whole of the semiconductor film may be crystallized using any other method known in the art.

<Variations>

Figure 8:
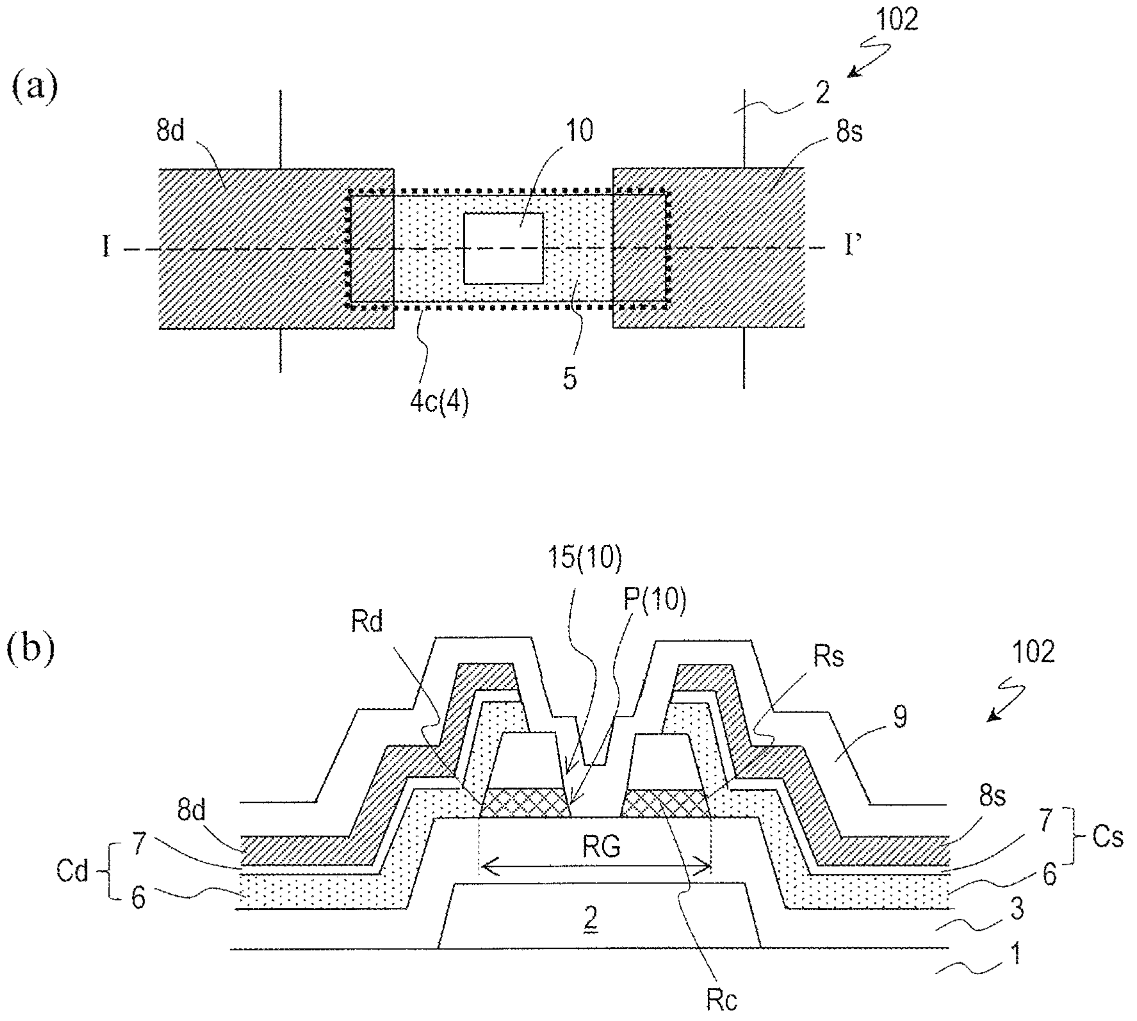
FIGS. 8(*a*) and 8(*b*) are a plan view and a cross-sectional view illustrating another TFT 102 according to one embodiment of the present invention.

FIGS. 8(*a*) and 8(*b*) are a plan view and a cross-sectional view illustrating another TFT 102 of the present embodiment. In FIG. 8, like elements to those of the TFT 101 shown in FIG. 1 are denoted by the same reference signs.

With the TFT 102, as indicated by a broken line in FIG. 8(*a*), the semiconductor layer 4 has an island-like pattern. As seen from the direction normal to the substrate 1, the periphery of the semiconductor layer 4 is aligned with the periphery of the protection layer 5. Therefore, in a region other than the TFT formation region, the first contact layer Cs and the second contact layer Cd are located between the source electrode 8*s* and the drain electrode 8*d* and the gate insulating layer 3, but the semiconductor layer 4 is absent. Therefore, the first contact layer Cs and the second contact layer Cd are in contact with the upper surface of the gate insulating layer 3.

In this example, the upper surface of the semiconductor layer 4 is in contact with neither the first contact layer Cs nor the second contact layer Cd. A portion of the side surface on the outer side (the side opposite to the channel region) of the semiconductor layer 4 is in contact with the first contact layer Cs, and another portion thereof is in contact with the second contact layer Cd. That is, a portion of the side surface of the semiconductor layer 4 that is in contact with the first contact layer Cs becomes the first region Rs, and a portion thereof that is in contact with the second contact layer Cd becomes the second region Rd.

Also with the TFT 102, as with the TFT 101, the semiconductor layer 4 may include both of the c-Si region 4*c* and the a-Si region 4*a* (see FIG. 12 and FIG. 13 to be described below). While the source-drain interval region RG is composed only of the c-Si region 4*c* in the illustrated example, it may include both of the c-Si region 4*c* and the a-Si region 4*a*.

It is preferred that the first region Rs and the second region Rd of the semiconductor layer 4 each include the c-Si region 4*c*. The first region Rs and the second region Rd may each be composed only of the c-Si region 4*c* or may include both of the c-Si region 4*c* and the a-Si region 4*a*.

Otherwise, the structure is similar to that of the TFT 101, and will not be described below.

Figure 9:
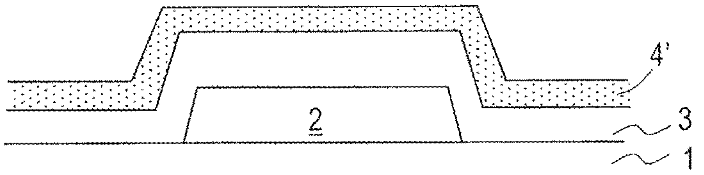
FIGS. 9(*a*) to 9(*e*) are schematic cross-sectional views illustrating an example of a method for manufacturing a TFT 102.
Figure 9:
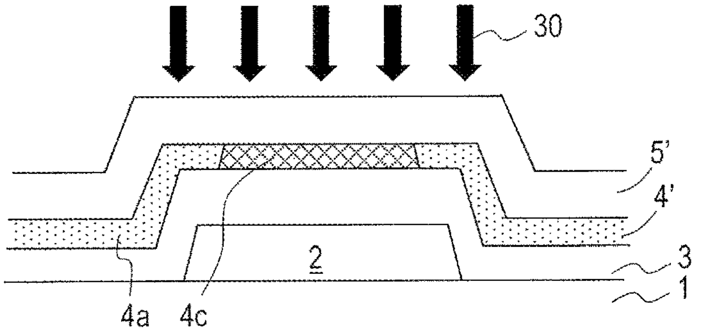
Figure 9:
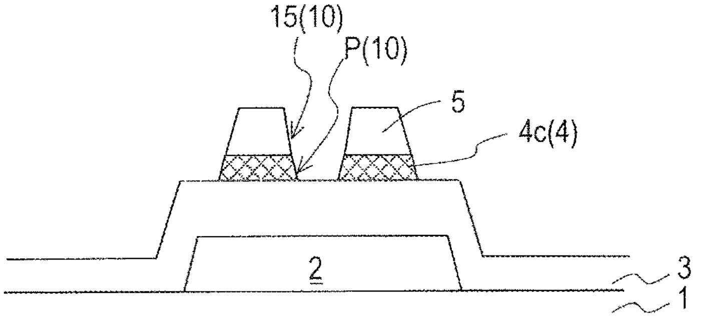
Figure 9:
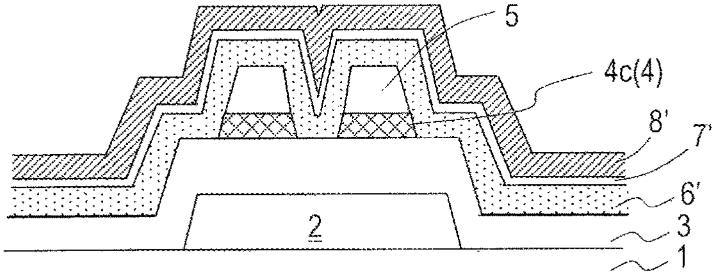
Figure 9:
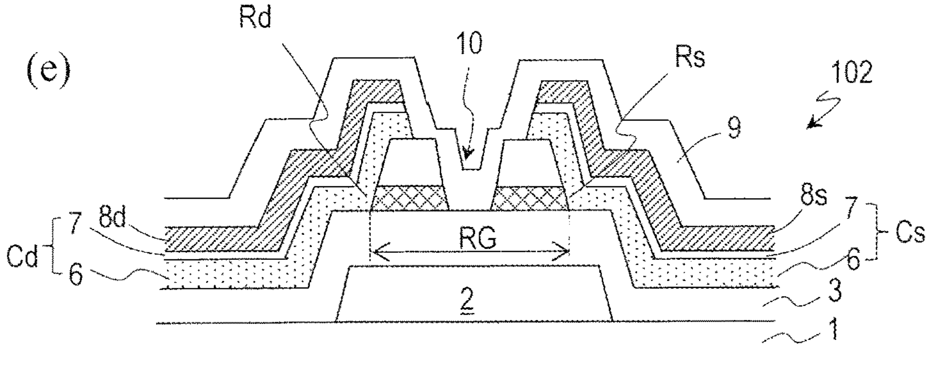

FIGS. 9(*a*) to 9(*e*) are step-by-step cross-sectional views illustrating an example of a method for manufacturing the TFT 102. Only what is different from the method for manufacturing the TFT 101 will be described below.

First, as shown in FIG. 9(*a*), the gate electrode 2, the gate insulating layer 3 and the semiconductor film 4' are formed on the substrate 1. Next, as shown in FIG. 9(*b*), the protection film 5' is formed on the semiconductor film 4', and at least a portion of a semiconductor layer formation region of the semiconductor film 4' that is to be the semiconductor layer of the TFT is irradiated with the laser light 30 (partial laser annealing) from above the protection film 5'. In this example, the entire semiconductor layer formation region is irradiated with the laser light 30 to be crystallized. Thus, the semiconductor film 4' including the c-Si region 4*c* and the a-Si region 4*a* is obtained.

Next, a first resist mask (not shown) is formed on the protection film 5', and the protection film 5' and the semiconductor film 4' are patterned by dry etching, for example, using the first resist mask. Thus, as shown in FIG. 9(*c*), the protection layer 5 of an island-like pattern having the protection layer opening 15 and the semiconductor layer 4 of an island-like pattern having the semiconductor layer opening P are obtained. The semiconductor layer opening P and the protection layer opening 15 together form the opening 10 that exposes the gate insulating layer 3. Although not shown in the figure, the surface of the exposed portion of the gate insulating layer 3 may possibly be etched (overetched).

Thereafter, as shown in FIG. 9(*d*), the first a-Si film 6', the second a-Si film 7' and the conductive film 8' are formed in this order so as to cover the semiconductor layer 4 and the protection layer 5. The first a-Si film 6' is arranged so as to be in contact with the side surface on the outer side (the side opposite to the channel region) of the semiconductor layer 4.

Then, as shown in FIG. 9(*e*), a second resist mask (not shown) is formed on the conductive film 8', and using the second resist mask, the conductive film 8' is etched (wet etched) and the second a-Si film 7' and the first a-Si film 6' are etched (dry etched). Thus, the first contact layer Cs and the second contact layer Cd, and the source electrode 8*s* and the drain electrode 8*d* are obtained. Portions of the first a-Si film 6', the second a-Si film 7' and the conductive film 8' that are located in the opening 10 are removed, thereby exposing the gate insulating layer 3 in the opening 10. Thus, the TFT 102 is obtained.

Thereafter, the inorganic insulating layer 9 is formed so as to cover the TFT 102. The inorganic insulating layer 9 is in contact with the gate insulating layer 3 in the opening 10.

<Arrangement and Area Percentage of c-Si Region 4*c*, Semiconductor Layer Opening P and a-Si Region 4*a* in Source-Drain Interval Region RG>

Next, the arrangement of the c-Si region 4*c*, the opening P and the a-Si region 4*a* in the source-drain interval region RG for the TFTs 101 and 102 of the present embodiment will be described in detail.

With the area of the source-drain interval region RG being equal, the OFF leak current of a TFT can be reduced by decreasing the percentage of the area of the c-Si region 4*c* with respect to the source-drain interval region RG (hereinafter, "c-Si area percentage") Sc, for example. The c-Si area percentage Sc can be decreased by decreasing the percentage of the area of the laser light irradiated region with respect to the source-drain interval region RG, for example. The c-Si area percentage Sc can be decreased also by providing an opening in the c-Si region 4*c* formed by laser irradiation.

For example, the c-Si area percentage Sc may be 50% or more and 95% or less, preferably 70% or more and 90% or less, for example. If 95% or less, it is possible to more effectively reduce the OFF leak current. On the other hand, if 50% or more, it is possible to ensure the ON characteristic.

The percentage (hereinafter, "opening area percentage") Sp of the area of the opening P or a notch (or the total area where a plurality of openings P or notches are arranged) with respect to the source-drain interval region RG may be 5% or more and 40% or less, preferably 5% or more and 25% or less, for example.

Even for the same c-Si area percentage Sc or the same opening area percentage Sp, it is possible to more effectively inhibit the current flow and further reduce the OFF leak current by the number and arrangement of openings P or notches, for example. Moreover, if the c-Si region 4*c* is divided into two or more portions by the a-Si region 4*a* or the opening P in the source-drain interval region RG, it may be possible to more effectively reduce the OFF leak current.

Next, our study on the relationship between the length of the c-Si region 4*c* in the channel width direction and the current characteristics of the TFT will be described below.

Figure 10:
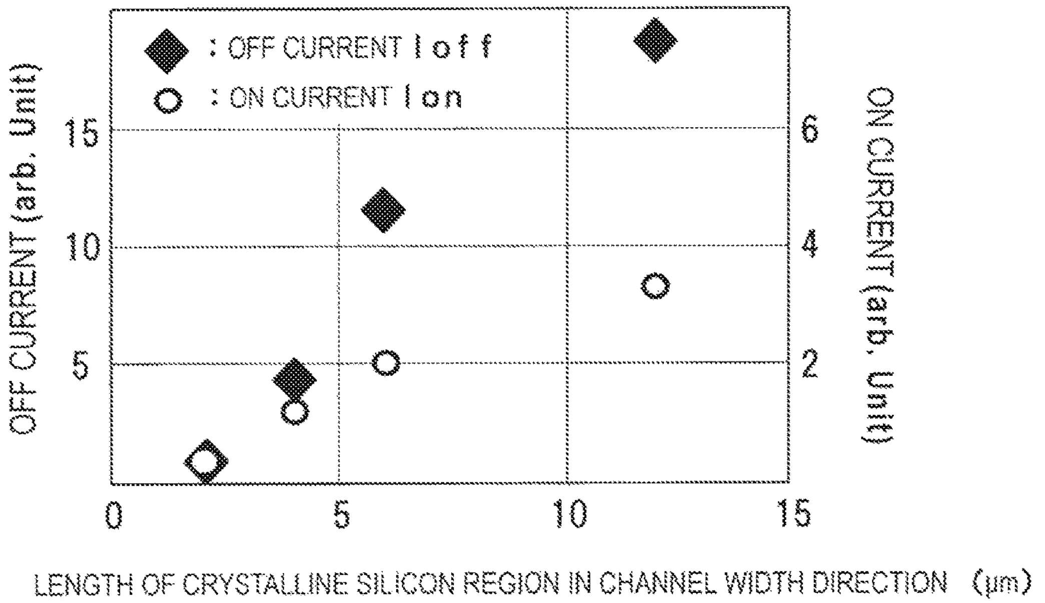
FIG. 10(*a*) is a graph showing the relationship between the length of the c-Si region in the channel width direction and the current characteristics of the TFT, and FIG. 10(*b*) is a graph showing the relationship between the length of the a-Si region in the channel width direction and the OFF current and the mobility of the TFT.
Figure 10:
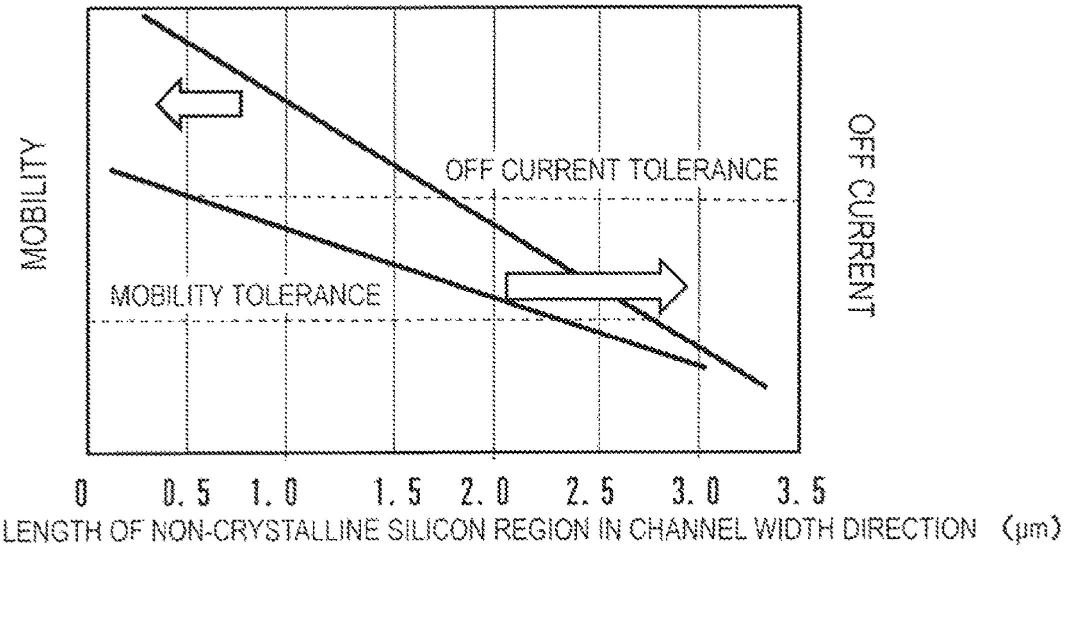

FIG. 10(*a*) is a graph showing the relationship between the length of the c-Si region 4*c* in the channel width direction with respect to the source-drain interval region RG and the ON current Ion and the OFF current (OFF leak current) Ioff of the TFT. Herein, the width of the laser light irradiated region of the semiconductor film was varied in semiconductor film laser crystallization so as to produce four sample TFTs having different lengths of the c-Si region 4*c* in the channel width direction, and the current characteristics of the sample TFTs were measured. The length of the c-Si region 4*c* in the channel length direction was constant among the sample TFTs. No opening was provided in the sample TFTs. Therefore, the c-Si area percentage Sc increases as the length of the c-Si region 4*c* in the channel width direction increases.

It can be seen from FIG. 10(*a*) that the ON current Ion and the OFF current Ioff of the TFT decrease as the length of the c-Si region 4*c* in the channel width direction with respect to the source-drain interval region RG decreases. It is believed that this is because the c-Si area percentage Sc decreased and the effective channel width decreased, making it difficult for the current to flow.

As shown in FIG. 10(*a*), the OFF current changes at a greater rate than the ON current in response to changing the length of the c-Si region 4*c* in the channel width direction. For example, when the length of the c-Si region 4*c* in the channel width direction is increased from 4 μm to 12 μm, the ON current increases by about 3 times but the OFF current increases by about 5 times. As a result, there may possibly be a greater disadvantage due to the increase of the OFF current. Conversely, when the length of the c-Si region 4*c* in the channel width direction is decreased, i.e., when the c-Si area percentage Sc is decreased, the rate of decrease of the OFF current is greater than the rate of decrease of the ON current. Thus, it is possible to effectively reduce the OFF current while suppressing the decrease of the ON current by controlling the length of the c-Si region 4*c* in the channel width direction or the c-Si area percentage Sc.

While the size of the laser light irradiated region is adjusted in this example, similar effects to FIG. 10(*a*) can be realized by decreasing the c-Si area percentage Sc and the effective channel width by providing the opening P (or a notch) in the c-Si region 4*c* after laser crystallization. With the provision of the opening P, the effective channel width decreases by the length of the opening P in the channel width direction in a portion of the source-drain interval region RG (defined by the length of the opening P in the channel length direction). Therefore, it is possible to reduce the OFF leak current by adjusting the size of the opening P. The OFF leak current may be more effectively decreased by providing two or more openings P in the source-drain interval region RG.

The maximum value (hereinafter, "first opening length") of the length of the opening P or a notch (the total area where a plurality of openings P or notches are arranged) in the channel width direction of the source-drain interval region RG may be 30% or more and 70% or less, preferably 30% or more and 50% or less, for example, of the length W of the source-drain interval region RG in the channel width direction. Therefore, it is possible to more effectively reduce the OFF leak current while ensuring a predetermined ON current. Note that where only one opening P is arranged in the channel width direction, the length of the opening P in the channel width direction is the "first opening length". Where two or more openings P are arranged in the channel width direction, the maximum value of the total length of these opening P in the channel width direction is the "first opening length".

The maximum value (hereinafter, "second opening length") of the length (or the total length) of the opening P or a notch in the channel length direction of the source-drain interval region RG may be 20% or more and 100% or less, preferably 20% or more and 50% or less, for example, of the length L in the channel length direction of the source-drain interval region RG. Therefore, it is possible to more effectively reduce the OFF leak current while ensuring a predetermined ON current. Note that where only one opening P is arranged in the channel length direction, the length of the opening P in the channel length direction is the "second opening length". Where two or more openings P are arranged in the channel length direction, the maximum value of the total length of these openings P in the channel length direction is the "second opening length".

The c-Si area percentage Sc may be decreased by arranging the a-Si region 4*a* in the source-drain interval region RG.

The percentage (hereinafter, "a-Si area percentage") Sa of the area of the a-Si region 4*a* with respect to the source-drain interval region RG may be 2% or more and 20% or less, preferably 5% or more and 10% or less, for example, although it is dependent on the opening area percentage Sp. As an example, the c-Si region 4*c* may be divided into two or more portions in the channel length direction by arranging the a-Si region 4*a* along the channel width direction of the semiconductor layer 4. Alternatively, the c-Si region 4*c* may be divided into two or more portions in the channel width direction by arranging the a-Si region 4*a* along the channel length direction of the semiconductor layer 4.

FIG. 10(*b*) is a schematic graph showing the relationship between the length of the a-Si region 4*a* in the channel length direction where the a-Si region 4*a* is formed along the channel width direction of the semiconductor layer 4, and the mobility and the ON current of the channel region Re. No opening is provided in the semiconductor layer 4.

As shown in FIG. 10(*b*), as the length of the a-Si region 4*a* in the channel length direction increases, the percentage of the a-Si region 4*a* in the current path increases, thereby lowering the mobility and making it difficult for the current to flow (the OFF current decreases). The OFF current can be suppressed to be less than or equal to a predetermined value if the length of the a-Si region 4*a* in the channel length direction is 0.5 μm or more, preferably 1 μm or more, for example. On the other hand, the length of the a-Si region 4*a* in the channel length direction may be less than or equal to ¼ of the length of the source-drain interval region RG in the channel length direction, for example. In order to more reliably ensure a predetermined mobility, the length of the a-Si region 4*a* in the channel length direction may be set to 2.5 μm or less, for example. Note that in the present embodiment, the a-Si region 4*a* of a minute width (for example, 2.5 μm or less) can be arranged in the semiconductor layer 4 so that a predetermined region of the semiconductor layer 4 can be selectively crystallized by partial laser annealing.

Two or more a-Si regions 4*a* may be arranged spaced apart from each other in the source-drain interval region RG so as to divide the c-Si region 4*c* into three or more portions. The shape of the a-Si region 4*a* is not limited to a rectangular shape. Detailed description and illustration in the figures are omitted because the details are described in International Publication WO2016/157351, which is herein incorporated by reference.

Taking the process precision of the photolithography process into consideration, it is preferred that the width in the channel width direction (channel width) W of the source-drain interval region RG is 13 μm or more and the width in the channel length direction (channel length) L thereof is 13 μm or more for the TFTs 101 and 102.

Taking the process precision into consideration, the width (design value) of each opening P or notch of the semiconductor layer 4 in the channel length direction and the channel width direction is preferably 4 μm or more. The distance (design value) from the periphery of the source-drain interval region RG to the closest opening P is preferably 4 μm or more, for example.

The length of each laser light irradiated region in the channel width direction is preferably 9 μm or more, for example, taking into consideration the resolution and the positional precision of the exposure machine. Then, even if misalignment occurs, since the c-Si region 4*c* is arranged with a predetermined width in the semiconductor layer 4, it is possible to connect the first contact layer Cs and the second contact layer Cd to the c-Si region 4*c*, and it is possible to suppress an increase in the ON resistance of the TFT.

Arrangement examples of openings P or notches Q in the source-drain interval region RG of the semiconductor layer 4 will now be described in greater detail with reference to the drawings.

Figure 11:
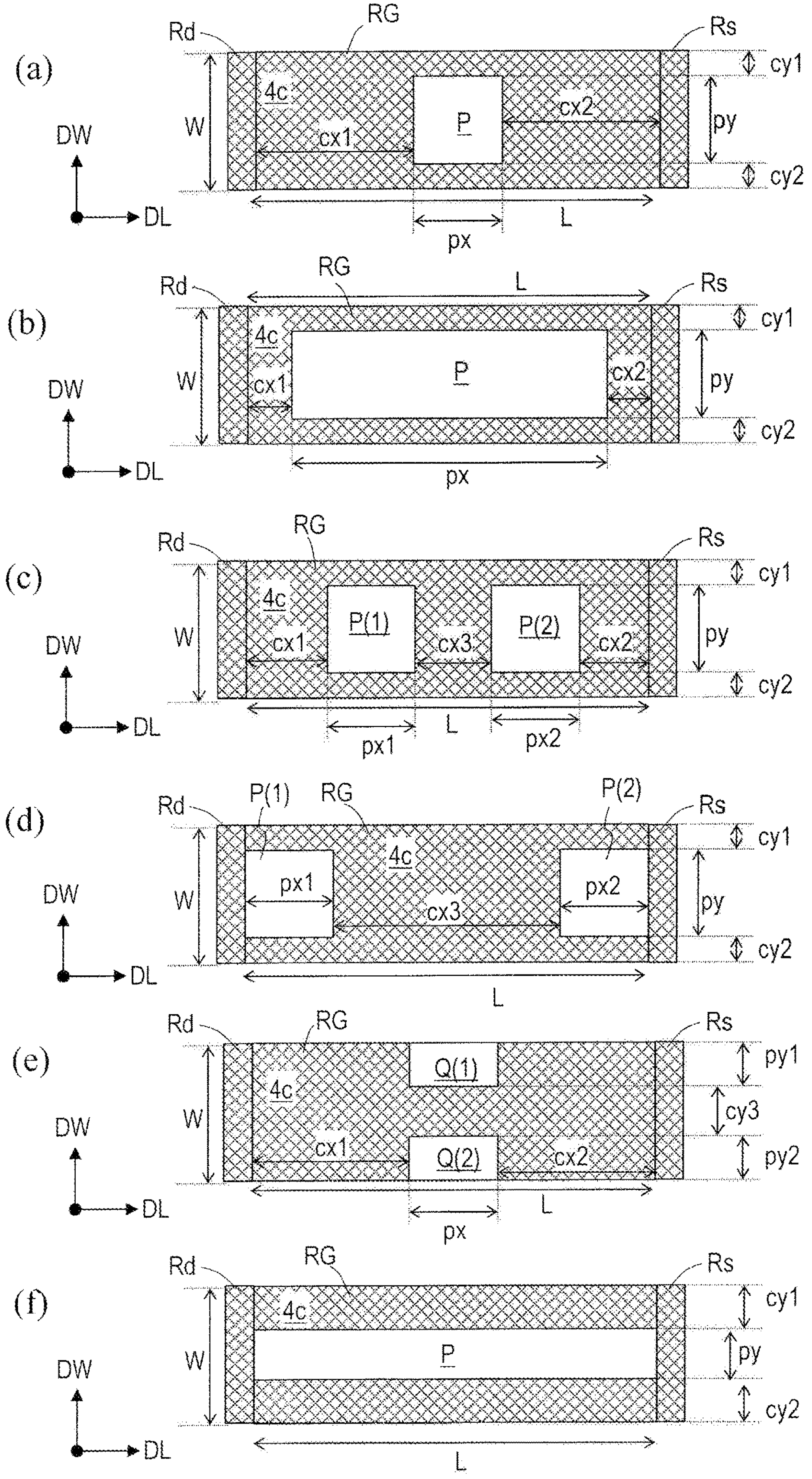
FIGS. 11(*a*) to 11(*f*) are schematic plan views showing Arrangement Examples 1 to 6, respectively, of openings P or notches Q in the source-drain interval region.

FIGS. 11(*a*) to 11(*f*) are plan views showing Arrangement Examples 1 to 6, respectively, of openings P or notches Q for the TFTs 101 and 102 of the present embodiment. FIG. 11 only shows the source-drain interval region RG, the second region Rd and the first region Rs of the semiconductor layer of the TFT. For the sake of simplicity, layers other than the semiconductor layer, e.g., the contact layer and the protection layer, are not shown.

In Arrangement Examples 1 to 6, the source-drain interval region RG, the second region Rd and the first region Rs include no a-Si region but are composed only of the c-Si region 4*c*. In any of these examples, the length W of the source-drain interval region RG in the channel width direction DW is 13 m, and the length L thereof in the channel length direction DL is 22 μm.

Although an example where the source-drain interval region RG has a rectangular shape that is elongated in the channel length direction DL is shown herein, the source-drain interval region RG may be elongated in the channel width direction DW or may be not rectangular. Similarly, although an example where the opening P has a rectangular shape is shown, the shape of the opening P does not need to be a rectangular shape.

In Arrangement Example 1 shown in FIG. 11(*a*), a single opening P is arranged in the source-drain interval region RG. The opening P may be arranged generally at the center of the source-drain interval region RG in the channel length direction DL and in the channel width direction DW. In Arrangement Example 1, the current flowing in the center of the semiconductor layer 4 in the channel length direction DL needs to go around the opening P. Therefore, the current flow is inhibited, thereby decreasing the OFF leak current and the ON current.

As an example, the length py (=first opening length) of the opening P in the channel width direction DW is 5 μm, the length px (=second opening length) thereof in the channel length direction DL is 5 μm, the distance cy1, cy2 from the periphery of the source-drain interval region RG to the opening P in the channel width direction DW is 4 μm, and the distance cx1, cx2 from the periphery of the source-drain interval region RG to the opening P in the channel length direction DL is 8.5 μm.

Note that due to misalignment, etc., in the manufacturing process, the opening P may not be arranged generally at the center. As a result of the alignment between the opening P and the semiconductor layer 4 being shifted in the channel width direction DW, a notch may be formed instead of an opening P, depending on the design value and the amount of misalignment. Also in such a case, it is possible to reduce the OFF leak current and it is possible to realize desired TFT characteristics.

In Arrangement Example 2 shown in FIG. 11(*b*), as in Arrangement Example 1 shown in FIG. 11(*a*), there is a single opening P. Note however that the distance cx1, cx2 between the periphery of the source-drain interval region RG and the opening P is set to the minimum value taking the process precision into consideration, the size of the opening P is set to be as larger as possible. In Arrangement Example 2, the effective channel area can be made smaller than in Arrangement Example 1, and it is therefore possible to further reduce the OFF leak current.

As an example, the length py (=first opening length) of the opening P in the channel width direction DW is 5 μm, the length px (=second opening length) thereof in the channel length direction DL is 14 μm, the distance cy1, cy2 from the periphery of the source-drain interval region RG to the opening P in the channel width direction DW is 4 μm, and the distance cx1, cx2 from the periphery of the source-drain interval region RG to the opening P in the channel length direction DL is 4 μm.

Arrangement Examples 3 and 4 shown in FIG. 11(*c*) and FIG. 11(*d*) are different from Arrangement Example 1 shown in FIG. 11(*a*) in that two openings P(1) and P(2) (hereinafter, referred to also collectively as "the openings P") are arranged in the source-drain interval region RG. These openings P are arranged with an interval therebetween in the channel length direction DL. Taking the process precision into consideration, the interval cx3 between the openings P is set to 4 μm or more, for example. By arranging openings P at two or more locations, it is possible to more effectively inhibit the current flow, and it is possible to further reduce the OFF leak current.

In Arrangement Example 3, the interval cx3 between the two openings P is set to the minimum value taking the process precision into consideration. In Arrangement Example 3, as an example, the length py of each opening P in the channel width direction DW is 5 μm, the length px1, px2 thereof in the channel length direction DL is 5 μm, the first opening length (=py) is 5 μm, the second opening length (=px1+px2) is 10 μm, the distance cy1, cy2 from the periphery of the source-drain interval region RG to the opening P in the channel width direction DW is 4 μm, the distance cx1, cx2 from the periphery of the source-drain interval region RG to the opening P in the channel length direction DL is 4 μm, and the interval cx3 between the openings P is 4 μm.

In Arrangement Example 4, openings P of the same size are arranged as farthest away as possible from each other. The openings P may be arranged at end portions of the source-drain interval region RG so as to be in contact with the first region Rs or the second region Rd. Such a configuration can be formed by, for example, forming the protection layer 5 having notches at the opposite end portions (the source side end portion and the drain side end portion), and etching the semiconductor film using this protection layer 5 as a mask.

In Arrangement Example 4, as an example, the distance cx1, cx2 from the periphery of the source-drain interval region RG to the openings P in the channel length direction DL is 0 μm, and the interval cx3 between the openings P is 12 μm. The other lengths py, px, cy1 and cy2 are equal to those in Arrangement Example 3.

In Arrangement Example 5 shown in FIG. 11(*e*), two notches Q(1) and Q(2) (hereinafter, referred to also collectively as "the notches Q") are arranged in the source-drain interval region RG. The notches Q are arranged with an interval cy3 therebetween in the channel width direction DW. Taking the process precision into consideration, the interval cy3 between the notches Q is set to 4 μm or more, for example. In Arrangement Example 5, the channel region Rc has a narrowed portion that is formed by the notches Q, making it difficult for the current to flow in the channel length direction DL and decreasing the OFF leak current.

As an example, the length py1, py2 of the notches Q in the channel width direction DW is 4.5 μm, the length px thereof in the channel length direction DL is 5 μm, the first opening length (=py1+py2) is 9 μm, the second opening length is 5 μm, the distance cx1, cx2 from the periphery of the source-drain interval region RG to the opening P in the channel length direction DL is 8.5 μm, and the interval cy3 between the notches Q is 4 μm.

In Arrangement Example 6 shown in FIG. 11(*f*), the opening P is arranged across the length L of the source-drain interval region RG in the channel length direction DL, and the c-Si region 4*c* is divided into two portions by the opening P in the source-drain interval region RG. That is, there is obtained a structure in which two channel regions having a small channel width are arranged in parallel to each other. These channel regions are connected together by the first region Rs and the second region Rd.

For example, such a structure can be formed by forming a protection layer 5 that is divided into two island-like patterns by a groove (protection layer opening), and patterning the semiconductor film using this as a mask.

In Arrangement Example 6, for example, the length py (=first opening length) of the opening P in the channel width direction DW is 5 μm, the length px (=second opening length) thereof in the channel length direction DL is 22 μm, and the distance cy1, cy2 from the periphery of the source-drain interval region RG to the opening P in the channel width direction DW is 4 μm.

Table 1 shows the c-Si area percentage Sc, the opening area percentage Sp, the percentage of the first opening length with respect to the length W of the source-drain interval region RG in the channel width direction, and the percentage of the second opening length with respect to the length L of the source-drain interval region RG in the channel length direction for Arrangement Examples 1 to 6.

TABLE 1

| Arrangement example | c-Si area percentage Sc | Opening area percentage Sp | a-Si area percentage Sa | First opening length/ length W | Second opening length/ length L |
|---|---|---|---|---|---|
| 1 | 91.3% | 8.7% | — | 0.38 | 0.23 |
| 2 | 75.5% | 24.5% | — | 0.38 | 0.64 |
| 3 | 82.5% | 17.5% | — | 0.38 | 0.45 |
| 4 | 82.5% | 17.5% | — | 0.38 | 0.45 |
| 5 | 84.3% | 15.7% | — | 0.69 | 0.23 |
| 6 | 61.5% | 38.5% | — | 0.38 | 1.0 |
| 7 | 85.7% | 8.7% | 5.6% | 0.38 | 0.23 |
| 8 | 69.9% | 24.5% | 5.6% | 0.38 | 0.64 |
| 9 | 73.4% | 17.5% | 9.1% | 0.38 | 0.45 |
| 10 | 73.4% | 17.5% | 9.1% | 0.38 | 0.45 |
| 11 | 81.5% | 15.7% | 2.8% | 0.69 | 0.23 |
| 12 | 56.0% | 38.5% | 5.6% | 0.38 | 1.0 |

Figure 12:
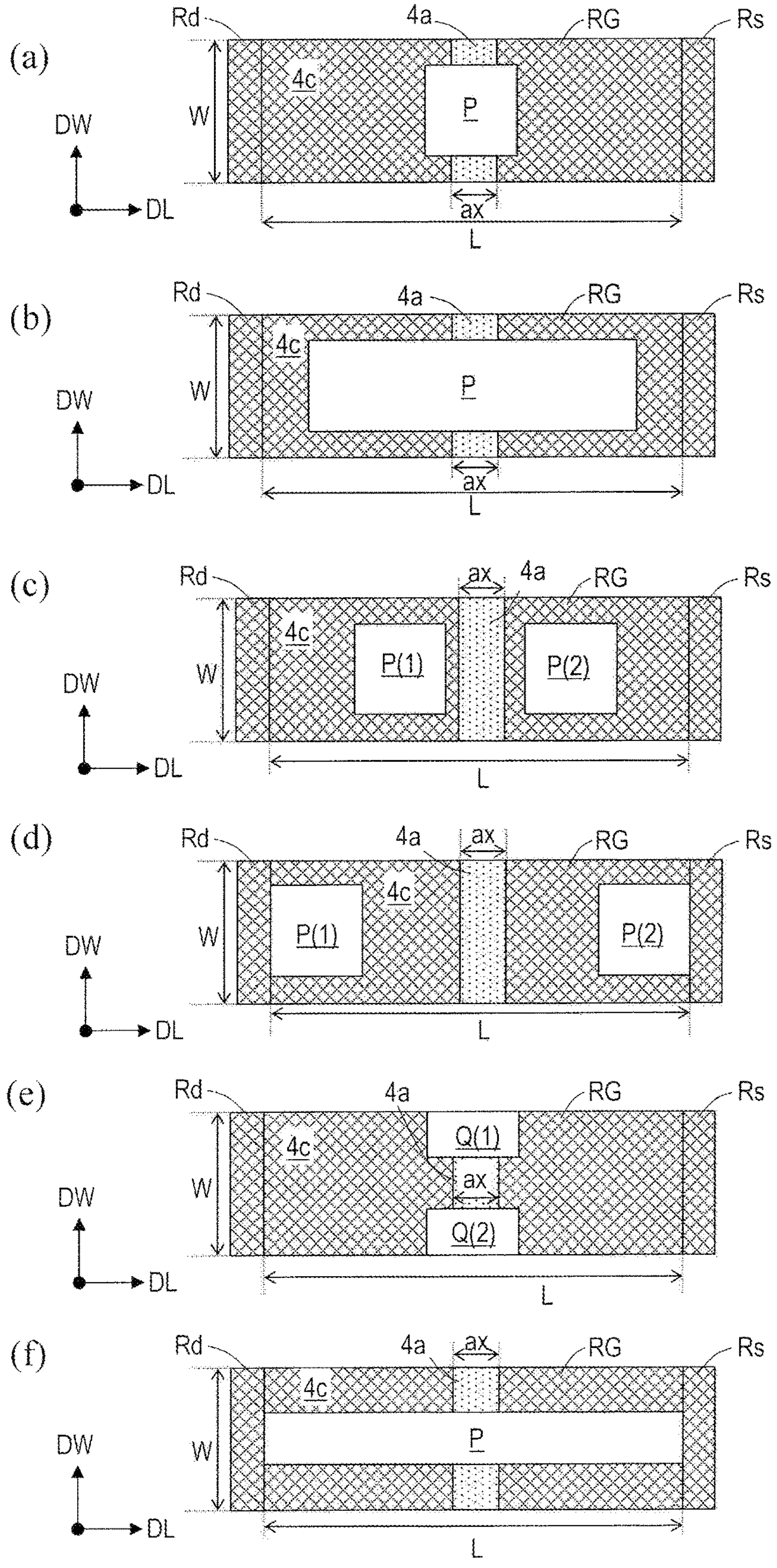
FIGS. 12(*a*) to 12(*f*) are schematic plan views showing Arrangement Examples 7 to 12, respectively, of openings P or notches Q and an a-Si region 4*a* in the source-drain interval region.
Figure 13:
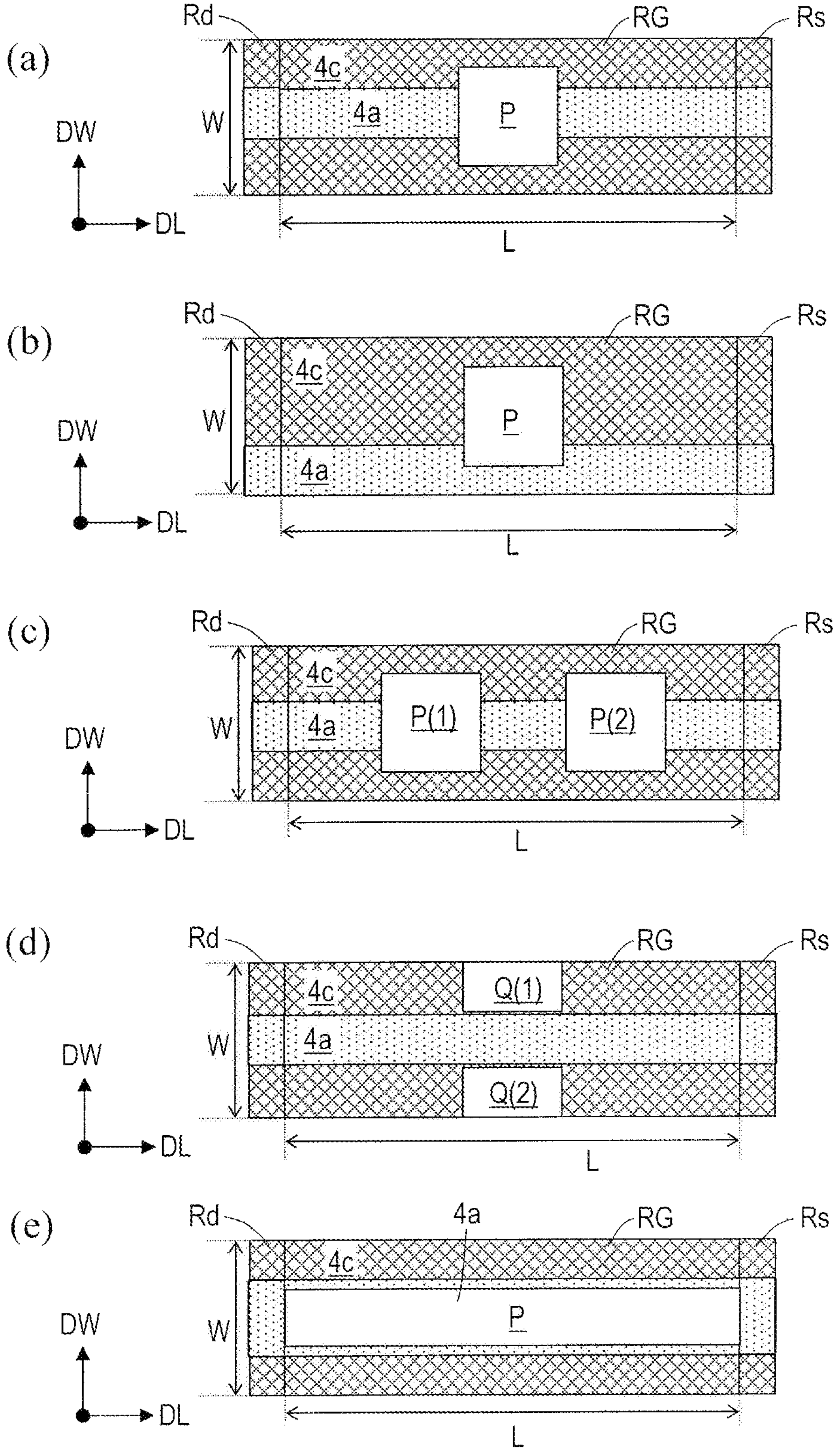
FIGS. 13(*a*) to 13(*e*) are schematic plan views illustrating other arrangement examples of openings P or notches Q and the a-Si region 4*a* in the source-drain interval region.

FIGS. 12(*a*) to 12(*f*) are plan views illustrating Arrangement Examples 7 to 12, respectively, of openings P or notches Q and the a-Si region 4*a* of the present embodiment. FIG. 12 only shows the source-drain interval region RG, the second region Rd and the first region Rs of the semiconductor layer of the TFT. In Arrangement Examples 7 to 12, the c-Si region 4*c* and the a-Si region 4*a* are provided in the source-drain interval region RG. The arrangements of openings P or notches Q of Arrangement Examples 7 to 12 are similar to Arrangement Examples 1 to 6, respectively, shown in FIG. 11.

In Arrangement Examples 7 to 12, the a-Si region 4*a* is arranged generally at the center of the source-drain interval region RG so as to extend along the channel width direction DW. Therefore, the c-Si region 4*c* is divided into two by the a-Si region 4*a*. Thus, the current flow is more inhibited by arranging the c-Si region 4*c* discontinuously in the channel length direction DL in the source-drain interval region RG (see FIG. 10(*b*)). By arranging a combination of the a-Si region 4*a* and openings P or notches Q in the source-drain interval region RG, it is possible to control the ON current and the OFF current with a higher degree of freedom and in a more strict manner.

As shown in FIGS. 12(*a*), 12(*b*), 12(*e*) and 12(*f*), the openings P or notches Q may be arranged on a portion of the interface between the c-Si region 4*c* and the a-Si region 4*a*. Then, it is possible to arrange the a-Si region 4*a* in a portion where the effective channel width is narrowed, and it is therefore possible to more effectively inhibit the current flow.

As shown in FIGS. 12(*c*) and 12(*d*), the a-Si region 4*a* may be arranged between two openings P. In these examples, since the opening P is arranged in the c-Si region 4*c*, it is possible to effectively reduce the c-Si area percentage Sc.

Table 1 also shows the c-Si area percentage Sc and the percentage (hereinafter, "a-Si area percentage") Sa of the area of the a-Si region 4*a* with respect to the source-drain interval region RG for Arrangement Examples 7 to 12 in a case where the length ax of the a-Si region 4*a* is 2 μm, for example. The opening area percentage Sp, etc., are the same as those of Arrangement Examples 1 to 6.

Note that the arrangement and the size of the a-Si region 4*a* are not limited to those of the illustrated example. For example, as illustrated in FIGS. 13(*a*) to 13(*e*), the a-Si region 4*a* may be arranged so as to extend along the channel length direction DL. Then, it is possible to reduce the length of the c-Si region 4*c* in the channel width direction DW. The c-Si region 4*c* can be divided by the a-Si region 4*a* into two or more portions. By arranging the a-Si region 4*a* so as to extend along the channel length direction DL, it is possible to decrease the effective channel width entirely along the channel length direction DL.

INDUSTRIAL APPLICABILITY

The embodiments of the present invention are widely applicable to devices and electronic appliances including a TFTs. For example, the embodiments of the present invention are applicable to circuit substrates such as active matrix substrates, display devices such as liquid crystal display devices, organic electroluminescence (EL) display devices and inorganic electroluminescence display devices, radiation detectors, imaging devices such as image sensors, electronic devices such as image input devices and fingerprint reader devices, etc.

REFERENCE SIGNS LIST

1: Substrate
2: Gate electrode
3: Gate insulating layer
4: Semiconductor layer
4*a*: a-Si region
4*c*: c-Si region
5: Protection layer
6: First a-Si layer
7: Second a-Si layer
8*d*: Drain electrode
8*s*: Source electrode
9: Inorganic insulating layer
10: Opening
15: Protection layer opening
101, 102: Thin film transistor
Cs: First contact layer
Cd: Second contact layer
P: Semiconductor layer opening
RG: Source-drain interval region
Rc: Channel region
Rs: First region
Rd: Second region

The invention claimed is:

1. A semiconductor device including a thin film transistor, wherein:
the thin film transistor includes:
a substrate;
a gate electrode supported on the substrate;
a semiconductor layer provided on the gate electrode with a gate insulating layer therebetween, wherein the semiconductor layer includes a first region, a second region, and a source-drain interval region that is located between the first region and the second region and overlaps with the gate electrode as seen from a direction normal to the substrate, the source-drain interval region including a channel region;
a protection layer arranged on the semiconductor layer so as to be in contact with at least a portion of an upper surface of the channel region;
a first contact layer in contact with the first region, and a second contact layer in contact with the second region;
a source electrode electrically connected to the first region with the first contact layer therebetween; and
a drain electrode electrically connected to the second region with the second contact layer therebetween;
the semiconductor layer includes a crystalline silicon region, and at least a portion of the crystalline silicon region is located in the source-drain interval region; and
at least one opening is provided that runs through the protection layer and the semiconductor layer and reaches the gate insulating layer, wherein the at least one opening is located in the source-drain interval region as seen from the direction normal to the substrate.

2. The semiconductor device according to claim 1, further comprising:
an insulating layer covering the thin film transistor,
wherein the insulating layer is in contact with the gate insulating layer in the at least one opening.

3. The semiconductor device according to claim 1, wherein:
the first contact layer and the second contact layer each include:
a first amorphous silicon layer in contact with the semiconductor layer; and
a second amorphous silicon layer arranged on the first amorphous silicon layer and having a conductivity higher than the first amorphous silicon layer.

4. The semiconductor device according to claim 1, wherein the semiconductor layer further includes a non-crystalline silicon region.

5. The semiconductor device according to claim 4, wherein at least a portion of the non-crystalline silicon region is arranged in the source-drain interval region.

6. The semiconductor device according to claim 5, wherein in the source-drain interval region, the crystalline silicon region is divided into two or more by the at least a portion of the non-crystalline silicon region.

7. The semiconductor device according to claim 1, wherein the at least one opening is surrounded by the crystalline silicon region.

8. The semiconductor device according to claim 5, wherein the at least one opening is arranged on a portion of an interface between the crystalline silicon region and the non-crystalline silicon region.

9. The semiconductor device according to claim 5, wherein the at least one opening includes two openings arranged with an interval therebetween in a channel length direction of the thin film transistor, and at least a portion of the non-crystalline silicon region is located between the two openings.

10. The semiconductor device according to claim 1, wherein:
- the semiconductor device includes a display region having a plurality of pixels;
- the thin film transistor is arranged in each pixel of the display region;
- the semiconductor device further includes a driving circuit provided in a region other than the display region;
- the driving circuit includes another thin film transistor; and
- no opening is provided in a source-drain interval region of the other thin film transistor.

11. A method for manufacturing a semiconductor device including a thin film transistor, the method comprising:
- step (A) of preparing a substrate that includes, formed on a surface thereof, a gate electrode and a gate insulating layer covering the gate electrode;
- step (B) of forming a semiconductor film made of amorphous silicon on the gate insulating layer;
- crystallization step (C) of crystallizing by irradiating only a portion of a semiconductor layer formation region of the semiconductor film to be a semiconductor layer with laser light, thereby forming a crystalline silicon region in the portion of the semiconductor layer formation region, where a portion of the semiconductor layer formation region that is not irradiated with laser light becomes a non-crystalline silicon region, wherein at least a portion of the crystalline silicon region is arranged in a portion of the semiconductor layer formation region that is to be a channel region;
- step (D) of forming a protection film on the semiconductor film, wherein the step (D) is performed between the step (B) and the step (C) or after the step (C);
- step (E) of patterning the protection film so as to form a protection layer that covers at least a part of the portion to be the channel region and has a first opening or a first notch that exposes the semiconductor film;
- step (F) of forming a contact layer silicon film and a source and drain electrode conductive film in this order on the protection layer; and
- patterning step (G) of patterning the source and drain electrode conductive film and the contact layer silicon film using a first mask so as to form a source electrode and a drain electrode separated from each other and a first contact layer and a second contact layer separated from each other, and patterning the semiconductor film using the first mask and the protection layer as a mask so as to form the semiconductor layer, wherein the semiconductor layer has a second opening or a second notch that exposes the gate insulating layer at positions corresponding to the first opening and the first notch of the protection layer.

12. A method for manufacturing a semiconductor device including a thin film transistor, the method comprising:
- step (A) of preparing a substrate that includes, formed on a surface thereof, a gate electrode and a gate insulating layer covering the gate electrode;
- step (B) of forming a semiconductor film made of amorphous silicon on the gate insulating layer;
- crystallization step (C) of crystallizing by irradiating at least a portion of a semiconductor layer formation region of the semiconductor film to be a semiconductor layer with laser light, thereby forming a crystalline silicon region in the portion of the semiconductor layer formation region, where a portion of the semiconductor film that is not irradiated with laser light becomes a non-crystalline silicon region, wherein at least a portion of the crystalline silicon region is arranged in a portion of the semiconductor layer formation region that is to be a channel region;
- step (D) of forming a protection film on the semiconductor film, wherein the step (D) is performed between the step (B) and the step (C) or after the step (C);
- step (E) of patterning the protection film and the semiconductor film so as to form a protection layer and a semiconductor layer, wherein the semiconductor layer and the protection layer have an opening or a notch that exposes the gate insulating layer;
- step (F) of forming a contact layer silicon film and a source and drain electrode conductive film in this order so as to cover the protection layer and the semiconductor layer; and
- patterning step (G) of patterning the source and drain electrode conductive film and the contact layer silicon film using a first mask so as to form a source electrode and a drain electrode separated from each other and a first contact layer and a second contact layer separated from each other, and removing portions of the source and drain electrode conductive film and the contact layer silicon film that are located in the opening or the notch.

13. The method for manufacturing a semiconductor device according to claim 11, wherein in the step (C), at least a portion of the non-crystalline silicon region is located in the portion to be the channel region.

* * * * *